United States Patent
Azadet et al.

(10) Patent No.: US 7,363,576 B2
(45) Date of Patent: Apr. 22, 2008

(54) METHOD AND APPARATUS FOR PIPELINED JOINT EQUALIZATION AND DECODING FOR GIGABIT COMMUNICATIONS

(75) Inventors: Kameran Azadet, Morganville, NJ (US); Erich Franz Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 148 days.

(21) Appl. No.: 11/234,446

(22) Filed: Sep. 26, 2005

(65) Prior Publication Data

US 2006/0020877 A1  Jan. 26, 2006

Related U.S. Application Data

(62) Division of application No. 09/834,668, filed on Apr. 13, 2001, now Pat. No. 7,000,175.

(60) Provisional application No. 60/245,519, filed on Nov. 3, 2000.

(51) Int. Cl.
*H03M 13/03* (2006.01)

(52) U.S. Cl. .................. 714/794; 714/795; 714/796

(58) Field of Classification Search ........ 714/794–796; 375/262
See application file for complete search history.

(56) References Cited

U.S. PATENT DOCUMENTS

| | | | | |
|---|---|---|---|---|
| 4,606,027 | A * | 8/1986 | Otani | 714/795 |
| 5,291,523 | A * | 3/1994 | Bergmans et al. | 375/232 |
| 5,870,433 | A * | 2/1999 | Huber et al. | 375/233 |
| 6,035,006 | A | 3/2000 | Matui | |
| 6,201,831 | B1 | 3/2001 | Agazzi et al. | |
| 6,690,739 | B1 * | 2/2004 | Mui | 375/265 |

OTHER PUBLICATIONS

Keshab K. Parhi, "Pipelining in Algorithms with Quantizer Loops," IEEE Transactions on Circuits and Systems, vol. 38. No. 7, 745-754 (Jul. 1991).
Bednarz et al., "Design, Performance, and Extensions of the RAM-DFE Architecture," IEEE Transactions on Magnetics, vol. 31, No. 2, 1196-1201 (Mar. 1995).

* cited by examiner

*Primary Examiner*—Joseph D. Torres

(57) ABSTRACT

A method and apparatus for the implementation of reduced state sequence estimation is disclosed with an increased throughput using precomputation (look-ahead), with only a linear increase in hardware complexity with respect to the look-ahead depth. The present invention limits the increase in hardware complexity by taking advantage of past decisions (or survivor symbols). The critical path of a conventional RSSE implementation is broken up into at least two smaller critical paths using pipeline registers. Various reduced state sequence estimation implementations are disclosed that employ one-step or multiple-step look-ahead techniques to process a signal received from a dispersive channel having a channel memory.

17 Claims, 15 Drawing Sheets

COMPLEXITY AND CRITICAL PATH ANALYSIS TABLE -- 600

|  | MLSE | RSSE |
|---|---|---|
| COMPLEXITY |  |  |
| NO. OF STATES: | $2^L$ | $2^K$ |
| NO. OF BMs | $2^{L+1}$ | $2^{K+1}$ |
| ADDs IN DFU: | — | $S \times L$ |
| CRITICAL PATH | 2 ADDs<br>2-to-1 MUX | $L-K+3$ ADDs<br>2-to-1 MUX<br>LUT<br>SHIFT |

FIG. 10

COMPLEXITY AND CRITICAL PATH ANALYSIS TABLE OF PIPELINED RSSE -- 1000

|  | PIPELINED RSSE |
|---|---|
| COMPLEXITY |  |
| NO. OF BMs: | $2^{K+2}$ |
| ADDs IN DFU: | $S \times (L - M + 2M) = S \times (L + M)$ |
| CRITICAL PATH ($M = L - K$) | 2 ADDs<br>2-to-1 MUX |

METHOD AND APPARATUS FOR PIPELINED JOINT EQUALIZATION AND DECODING FOR GIGABIT COMMUNICATIONS

CROSS REFERENCE TO RELATED APPLICATIONS

This application is a divisional of pending U.S. application Ser. No. 09/834,668, filed Apr. 13, 2001 now U.S. Pat No. 7,000,175 which claims the benefit of U.S. Provisional Application Ser. No. 60/245,519, filed Nov. 3, 2000.

FIELD OF THE INVENTION

The present invention relates generally to channel equalization and decoding techniques, and more particularly, to sequence estimation techniques with shorter critical paths.

BACKGROUND OF THE INVENTION

The transmission rates for local area networks (LANs) that use unshielded twisted pair (UTP) copper cabling have progressively increased from 10 Megabits-per-second (Mbps) to 1 Gigabit-per-second (Gbps). The Gigabit Ethernet 1000 Base-T standard, for example, operates at a clock rate of 125 MHz and uses UTP cabling of Category 5 with four pairs to transmit 1 Gbps. Trellis-coded modulation (TCM) is employed by the transmitter, in a known manner, to achieve coding gain. The signals arriving at the receiver are typically corrupted by intersymbol interference (ISI), crosstalk, echo, and noise. A major challenge for 1000 Base-T receivers is to jointly equalize the channel and decode the corrupted trellis-coded signals at the demanded clock rate of 125 MHz, as the algorithms for joint equalization and decoding incorporate non-linear feedback loops that cannot be pipelined.

Data detection is often performed using maximum likelihood sequence estimation, to produce the output symbols or bits. A maximum likelihood sequence estimator considers all possible sequences and determines which sequence was actually transmitted, in a known manner. The maximum likelihood sequence estimator is the optimum decoder and applies the well-known Viterbi algorithm to perform joint equalization and decoding. For a more detailed discussion of a Viterbi implementation of a maximum likelihood sequence estimator (MLSE), see Gerhard Fettweis and Heinrich Meyr, "High-Speed Parallel Viterbi Decoding Algorithm and VLSI-Architecture," IEEE Communication Magazine (May 1991), incorporated by reference herein.

In order to reduce the hardware complexity for the maximum likelihood sequence estimator that applies the Viterbi algorithm, a number of sub-optimal approaches which are referred to as reduced-state sequence estimation (RSSE) have been proposed. For a discussion of reduced state sequence estimation techniques, as well as the special cases of decision-feedback sequence estimation (DFSE) and parallel decision-feedback decoding (PDFD) techniques, see, for example, P. R. Chevillat and E. Eleftheriou, "Decoding of Trellis-Encoded Signals in the Presence of Intersymbol Interference and Noise", IEEE Trans. Commun., vol. 37, 669-76, (July 1989), M. V. Eyuboglu and S. U. H. Qureshi, "Reduced-State Sequence Estimation For Coded Modulation On Intersymbol Interference Channels", IEEE JSAC, vol. 7, 989-95 (August 1989), or A. Duel-Hallen and C. Heegard, "Delayed Decision-Feedback Sequence Estimation," IEEE Trans. Commun., vol. 37, pp. 428-436, May 1989, each incorporated by reference herein.

Generally, reduced state sequence estimation techniques reduce the complexity of the maximum likelihood sequence estimators by merging several states. The RSSE technique incorporates non-linear feedback loops that cannot be pipelined. The critical path associated with these feedback loops is the limiting factor for high-speed implementations.

U.S. patent application Ser. No. 09/326,785, filed Jun. 4, 1999 and entitled "Method and Apparatus for Reducing the Computational Complexity and Relaxing the Critical Path of Reduced State Sequence Estimation (RSSE) Techniques," incorporated by reference herein, discloses a technique that reduces the hardware complexity of RSSE for a given number of states and also relaxes the critical path problem. U.S. patent application Ser. No. 09/471,920, filed Dec. 23, 1999, entitled "Method and Apparatus for Shortening the Critical Path of Reduced Complexity Sequence Estimation Techniques," incorporated by reference herein, discloses a technique that improves the throughput of RSSE by pre-computing the possible values for the branch metrics in a look-ahead fashion to permit pipelining and the shortening of the critical path. The complexity of the pre-computation technique, however, increases exponentially with the length of the channel impulse response. In addition, the delay through the selection circuitry that selects the actual branch metrics among all precomputed ones increases with L, eventually neutralizing the speed gain achieved by the precomputation.

A need therefore exists for a technique that increases the throughput of RSSE algorithms using precomputations with only a linear increase in hardware complexity with respect to the look-ahead computation depth.

SUMMARY OF THE INVENTION

Generally, a method and apparatus are disclosed for the implementation of reduced state sequence estimation with an increased throughput using precomputations (look-ahead), while only introducing a linear increase in hardware complexity with respect to the look-ahead depth. RSSE techniques typically decode a received signal and compensate for intersymbol interference using a decision feedback unit (DFU), a branch metrics unit (BMU), an add-compare-select unit (ACSU) and a survivor memory unit (SMU). The present invention limits the increase in hardware complexity by taking advantage of past decisions. The past decision may be a past ACS decision of the ACSU or a past survivor symbol in the SMU or a combination thereof. The critical path of a conventional RSSE implementation is broken up into at least two smaller critical paths using pipeline registers.

A reduced state sequence estimator is disclosed that employs a one-step look-ahead technique to process a signal received from a dispersive channel having a channel memory. Initially, a speculative intersymbol interference estimate is precomputed based on a combination of (i) a speculative partial intersymbol interference estimate for a first postcursor tap of the channel impulse response, based on each possible value for a data symbol, and (ii) a combination of partial intersymbol interference estimates for each subsequent postcursor tap of the channel impulse response, where at least one of the partial intersymbol interference estimates for the subsequent postcursor taps is based on a past survivor symbol from the corresponding state. In addition, a branch metric is precomputed based on the precomputed intersymbol interference estimate. One of the precomputed branch metrics is selected based on a past decision from the corresponding state. The past decision may be a past ACS decision of the ACSU or a past survivor symbol in the SMU or a combination of both. The selected branch metric is used to compute new path metrics for path extensions from a corresponding state. The computed new path metrics are used to determine the best survivor path and path metric for a corresponding state.

A reduced state sequence estimator is also disclosed that employs a multiple-step look-ahead technique to process a signal received from a dispersive channel having a channel memory. Initially, a speculative partial intersymbol interference estimate is precomputed for each of a plurality of postcursor taps of the channel impulse response, based on each possible value for a data symbol. Thereafter, a partial intersymbol interference estimate is selected for each of the plurality of postcursor taps other than a first postcursor tap based on a past decision from a corresponding state. The past decision may be a past ACS decision of the ACSU or a past survivor symbol in the SMU or a combination of both. A precomputed partial intersymbol interference estimate for the first postcursor tap is referred to as a precomputed intersymbol interference estimate. In addition, speculative branch metrics are precomputed based on the precomputed intersymbol interference estimates. One of the precomputed branch metrics is selected based on a past decision from a corresponding state. The past decision may be a past ACS decision of the ACSU or a past survivor symbol in the SMU or a combination of both. The selected branch metric is used to compute new path metrics for path extensions from a corresponding state. The computed new path metrics are used to determine the best survivor path and path metric for a corresponding state.

In further variations, intersymbol estimates can be selected among precomputed intersymbol interference estimates without precomputing branch metrics or the partial intersymbol interference estimates can be precomputed for a group of taps, with a precomputation for all possible data symbol combinations corresponding to the groups of taps and selection for each group.

A more complete understanding of the present invention, as well as further features and advantages of the present invention, will be obtained by reference to the following detailed description and drawings.

BRIEF DESCRIPTION OF THE DRAWINGS

FIG. 10 is a table analyzing the complexity and critical path of a pipelined RSSE in accordance with the present invention;

DETAILED DESCRIPTION

As previously indicated, the processing speed of conventional reduced state sequence estimation (RSSE) implementations is limited by a recursive feedback loop. According to one feature of the present invention, the processing speed of reduced state sequence estimation implementations is improved by pipelining the branch metric and decision-feedback computations, such that the critical path is reduced to be of the same order as in a traditional Viterbi decoder. The additional hardware required by the present invention scales only linearly with the look-ahead depth. The presented algorithm allows the VLSI implementation of RSSE for high-speed applications such as Gigabit Ethernet over copper. Reduced complexity sequence estimation techniques are disclosed for uncoded signals, where the underlying trellis has no parallel state transitions, as well as for signals encoded with a multi-dimensional trellis code having parallel transitions, such as signals encoded according to the 1000BASE-T Ethernet standard. It should be understood that the disclosed pipelining technique can be applied whenever RSSE is being used, e.g., to any kind of trellis or modulations scheme. The disclosed examples are used for illustration purposes only and do not intend to limit the scope of the invention.

System Model

Figure 1:
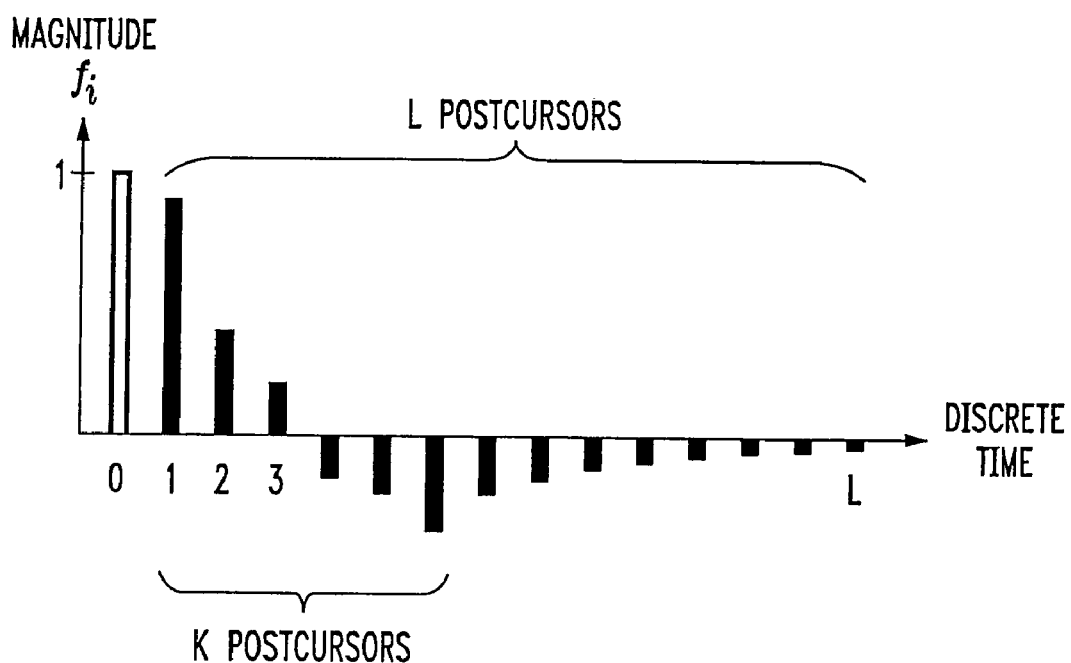
FIG. 1 illustrates a channel impulse response with channel memory, L.

FIG. 1 illustrates a channel impulse response with channel memory, L. As shown in FIG. 1, there is a main tap corresponding to time 0, and there are L postcursor taps. The first K postcursor taps shown in FIG. 1 after the main tap are used for the construction of the reduced-state trellis, as discussed below.

Figure 2:
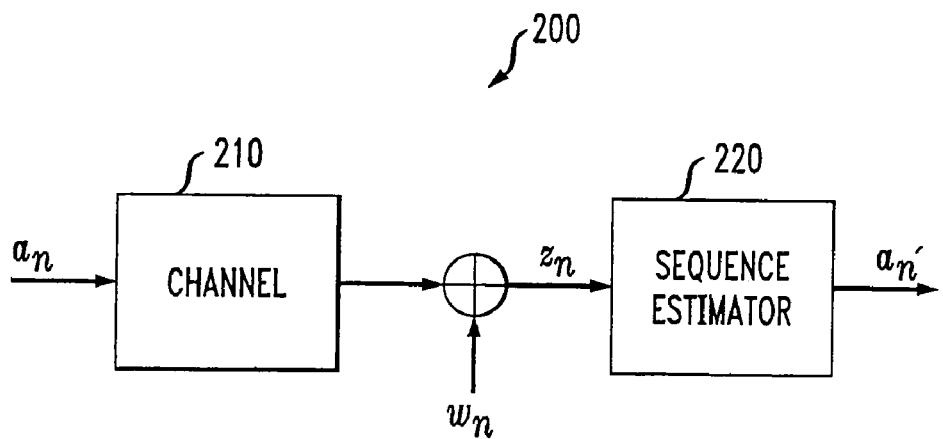
FIG. 2 illustrates a communication system in which the present invention may operate.

FIG. 2 illustrates a communication system 200 having a channel 210 and a sequence estimator 220. The output of the channel 210 at time n is given by $$z_n = \sum_{i=0}^{L} f_i \cdot a_{n-i} + w_n, \qquad (1)$$

where $\{f_i\}$, $0 \leq i \leq L$ are the finite impulse response channel coefficients ($f_0 = 1$ is assumed without loss of generality), L is the channel memory, $a_n$ is the data symbol at time n, and $w_n$ is zero-mean Gaussian noise. The decision of the sequence estimator 220 corresponding to $a_n$ is denoted by $a'_n$. While the illustrative embodiment assumes that the symbols are binary, i.e., $a_n = \{-1, 1\}$, and trellis-coded modulation (TCM) is not employed. The present invention may be applied, however, to non-binary modulation and TCM, such as the coding and modulation scheme used in Gigabit Ethernet over copper, as would be apparent to a person of ordinary skill in the art.

The optimum method for the recovery of the transmitted symbols is MLSE, which applies the Viterbi algorithm (VA) to the trellis defined by the channel state $$\rho_n = (a_{n-1}, a_{n-2}, \ldots, a_{n-L}). \qquad (2)$$

Figure 3:
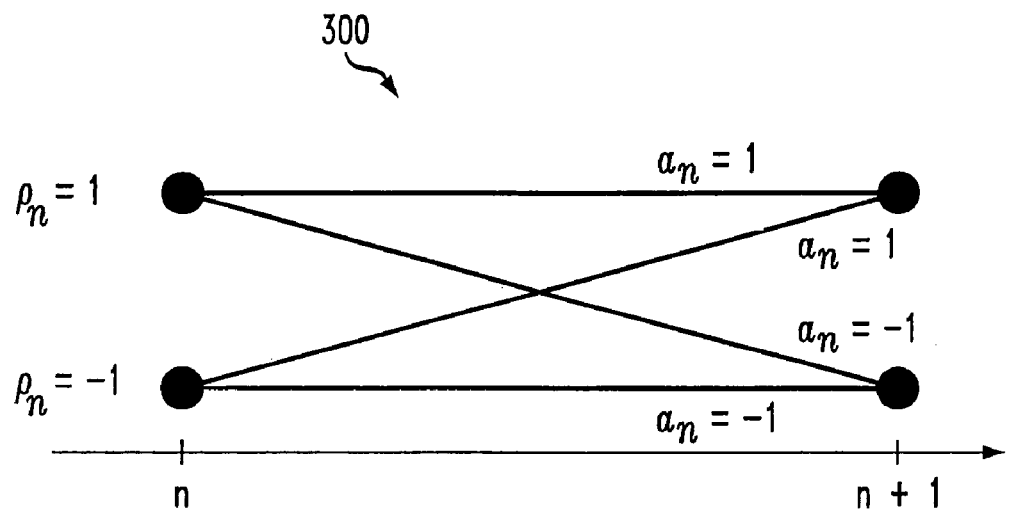
FIG. 3 illustrates a trellis associated with a channel of memory length L=1 and binary data symbols.

A binary symbol constellation is assumed. Thus, the number of states processed by the VA is given by:

$$S = 2^L, \qquad (3)$$

and two branches leave or enter each state of the trellis. FIG. 3 shows a trellis 300 associated with a channel of memory length L=1. The branch metric for a transition from state $\rho_n$ under input $a_n$ is given by $$\lambda_n(z_n, a_n, \rho_n) = (z_n - a_n - \sum_{i=1}^{L} f_i a_{n-i})^2. \qquad (4)$$

The VA determines the best survivor path into state $\rho_{n+1}$ from the two predecessor states $\{\rho_n\}$ by evaluating the following add-compare-select (ACS) function:

$$\Gamma_{n+1}(\rho_{n+1}) = \min_{\{\rho_n\} \mapsto \rho_{n+1}} (\Gamma_n(\rho_n) + \lambda_n(z_n, a_n, \rho_n)), \qquad (5)$$

where $\gamma_n(\rho_n)$ is the path metric for state $\rho_n$.

Figure 4:
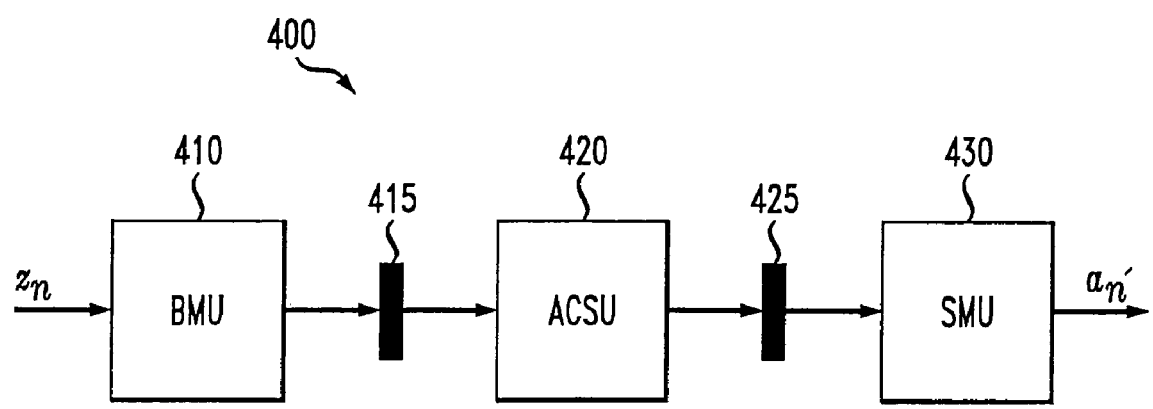
FIG. 4 illustrates a block diagram for an implementation of the Viterbi algorithm (VA)

The block diagram for an implementation of the VA is shown in FIG. 4. As shown in FIG. 4, the VA 400 includes a branch metrics unit (BMU) 410, an add-compare-select unit (ACSU) 420 and a survivor memory unit (SMU) 430. The BMU 410 calculates the $2^{L+1}$ branch metrics (BMs), the ACSU 420 performs the ACS operation for each of the S states, and the SMU 430 keeps track of the S survivor paths.

Figures 5, 6:
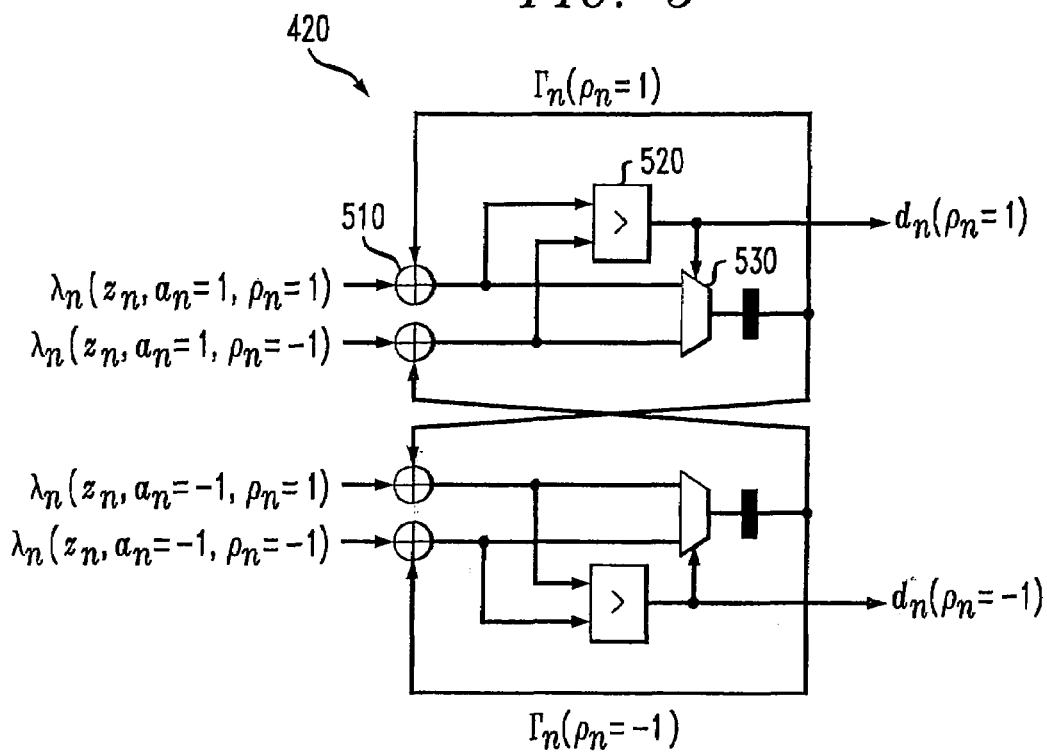
FIG. 5 illustrates a state-parallel implementation of the ACSU of FIG. 4 for a channel of memory L=1.
FIG. 6 is a table analyzing the complexity and critical path of MLSE and RSSE techniques.

The ACSU 420 is the bottleneck for maximum throughput as the operations in the BMU 410 and SMU 430 are feedforward and can thus be pipelined using pipeline registers 415 and 425. A state-parallel implementation of the ACSU 420 yields the highest processing speed and is shown in FIG. 5 for a channel of memory L=1 (the corresponding trellis was shown in FIG. 3).

The recursive loop of the ACS operation associated with equation (5) determines the critical path in the ACSU 420, as it cannot be pipelined. It can be seen from FIG. 5 that this loop comprises one addition (ADD) 510, one 2-way comparison 520, whose delay is about the same as one ADD, and a 2-way selection 530, corresponding to a 2-to-1 multiplexer (MUX). Hereinafter, shift registers will not be considered in the critical path analysis due to their minor delay. FIG. 6 is a table 600 analyzing the complexity and critical path of MLSE and RSSE. Column 620 of table 600 summarizes the computational complexity and critical path of MLSE for binary signals corrupted by a channel of memory L. It is noted that in addition to a state-parallel implementation shown in FIG. 5, the throughput of the VA can be even further increased by introducing parallelism on the bit, block and algorithmic level (for a good summary, see e.g. H. Meyr, M. Moeneclaey, and S. A. Fechtel, Digital Communication Receivers, John Wiley & Sons, pp. 568-569, 1998). However, this comes at a significant increase in complexity and/or latency.

Reduced-State Sequence Estimation

RSSE reduces the complexity of MLSE by truncating the channel memory $\rho_n$, as described in A. Duel-Hallen and C. Heegard, "Delayed Decision-Feedback Sequence Estimation," IEEE Trans. Commun., vol. 37, 428-436, May 1989, or applying set partitioning to the signal alphabet as described in P. R. Chevillat and E. Eleftheriou, "Decoding of Trellis-Encoded Signals in the Presence of Intersymbol Interference and Noise," IEEE Trans. Commun., vol. 37, pp. 669-676, July 1989 or M. V. Eyuboglu and S. U. Qureshi, "Reduced-State Sequence Estimation for Coded Modulation on Intersymbol Interference Channels," IEEE J. Sel. Areas Commun., vol. 7, pp. 989-995, August 1989. Similar to the VA, RSSE searches for the most likely data sequence in the reduced trellis by keeping only the best survivor path for each reduced state. In the exemplary embodiment discussed herein, the reduced state $\rho'_n$ is obtained by truncating equation (2) to K yielding $$\rho'_n = (a_{n-1}, a_{n-2}, \ldots, a_{n-K}), \, 0 \leq K \leq L. \qquad (6)$$

In this case, the number of reduced states is given by $$S' = 2^K. \qquad (7)$$

The results may be generalized to the cases given in P. R. Chevillat and E. Eleftheriou or M. V. Eyuboglu and S. U. Qureshi, referenced above. The branch metric for a transition from reduced state $\rho'_n$ under input $a_n$ is given by $$\lambda'_n(z_n, a_n, \rho'_n) = (z_n - a_n + u_n(\rho'_n))^2, \qquad (8)$$

where $$u_n(\rho'_n) = -\sum_{i=1}^{K} f_i a_{n-i} - \sum_{i=K}^{L} f_i \hat{a}_{n-i}(\rho'_n). \qquad (9)$$

In equation (9), $u_n(\rho'_n)$ is the decision-feedback for $\rho'_n$ and $\hat{a}_{n-i}(\rho'_n)$ is the symbol of the survivor path into state $\rho'_n$ which corresponds to time n−i. As the first K survivor symbols $(\hat{a}_{n-1}(\rho'_n), \hat{a}_{n-2}(\rho'_n), \ldots, \hat{a}_{n-K}(\rho'_n))$ from the survivor path into state $\rho'_n$ are equal to the symbols ($a_{n-1}, a_{n-2}, \ldots, a_{n-K}$) defining this state, equation (9) can be rewritten as $$u_n(\rho'_n) = -\sum_{i=1}^{L} f_i \hat{a}_{n-i}(\rho'_n). \qquad (10)$$

Among all paths entering reduced state $\rho'_{n+1}$ from the 2 predecessor states $\{\rho'_n\}$, the most likely path with metric $\gamma'_{n+1}(\rho'_{n+1})$ is chosen according to the ACS operation:

$$\Gamma'_{n+1}(\rho'_{n+1}) = \min_{\{\rho'_n\} \mapsto \rho'_{n+1}} (\Gamma'_n(\rho'_n) + \lambda'_n(z_n, a_n, \rho'_n)). \qquad (11)$$

Figures 7A, 7B:
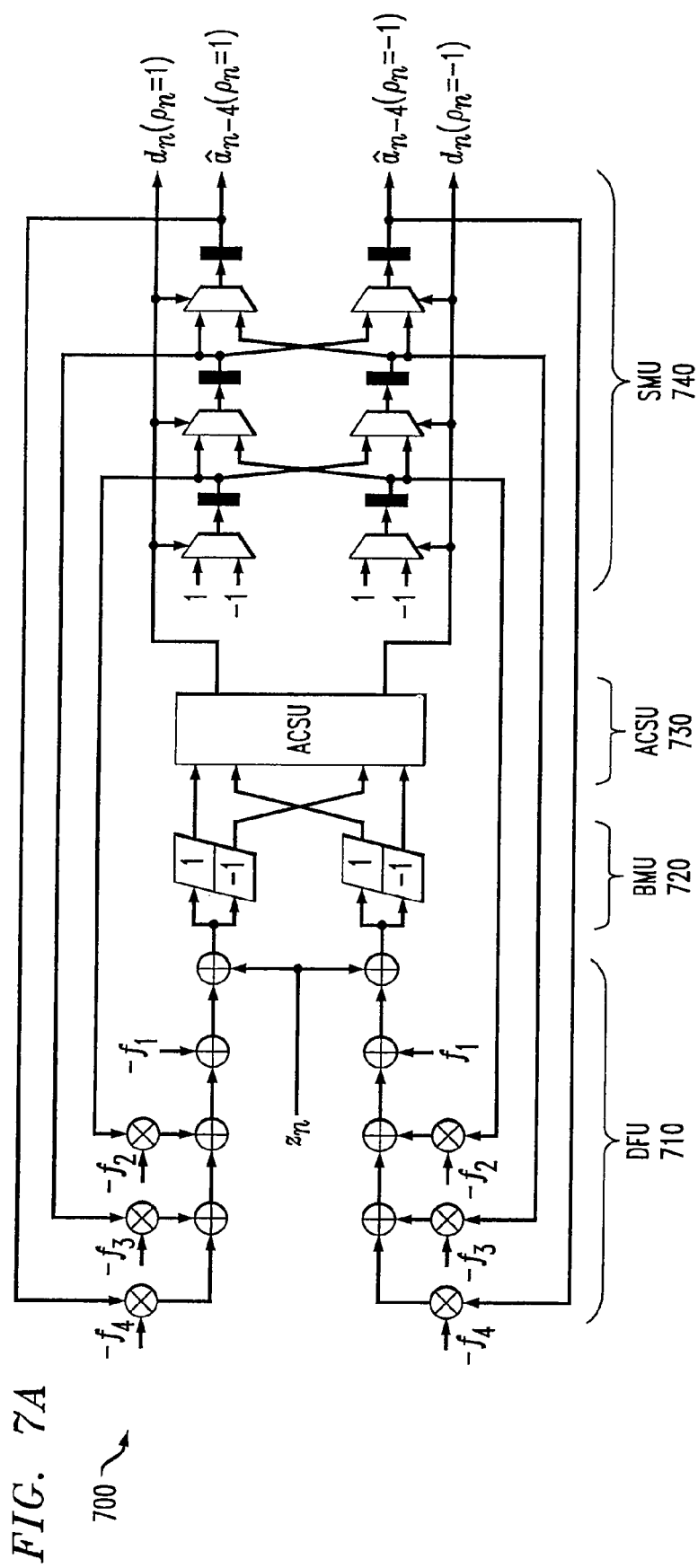
FIG. 7A illustrates the architecture of a reduced state sequence estimator.
FIG. 7B illustrates an implementation of the look-up tables in the BMU of FIG. 7A.

The state-parallel architecture for RSSE with the parameters L=4 and K=1 is shown in FIG. 7A. It can be seen from FIG. 7A that the RSSE 700 architecture comprises four functional blocks, namely, a decision feedback unit (DFU) 710, a branch metrics unit (BMU) 720, an add-compare-select unit (ACSU) 730 and a survivor memory unit (SMU) 740. As the corresponding reduced trellis is the same as the one in FIG. 3, the ACSU 730 shown in FIG. 7 has the same architecture as the ACSU 420 given in FIG. 5. The part of the SMU 740 that stores the L-K survivor symbols ($\hat{a}_{n-K-1}(\rho'_n)$, $\hat{a}_{n-K-2}(\rho'_n)$, ..., $\hat{a}_{n-L}(\rho'_n)$) for each reduced state must be implemented in a register-exchange-architecture as described in R. Cypher and C. B. Shung, "Generalized trace-back techniques for survivor memory management in the Viterbi algorithm," J. VLSI Signal Processing, vol. 5, pp. 85-94, 1993, as these symbols are required for the evaluation of equation (9) in the DFU 710 without delay. Because of the binary modulation, the multipliers in the DFU 710 can be implemented using shifters (SHIFTs). Look-up tables (LUTs) approximate the squaring function in equation (8) in the BMU, as defined by FIG. 7B.

RSSE 700 has less computational complexity than MLSE for the same channel memory L, as RSSE processes less states, at the expense of a significantly longer critical path. It can be seen from FIG. 7 that there is a recursive loop which comprises one SHIFT and L-K+1 ADDs in the DFU 710 (the first term in the right hand side of equation (9) can be computed outside the loop), one LUT in the BMU 720, one add-compare in the ACSU 730 (which is roughly equal to two ADDs in terms of delay), and a 2-to-1 MUX in the SMU 740. All these operations must be completed within one symbol period and cannot be pipelined. In contrast to this, the critical path in MLSE just comprises the ACS operation. Also, due to the different structure of the recursive loop in the RSSE 700, the block processing methods which have been developed to speed up the VA (see H. Meyr et al., Digital Communication Receivers, John Wiley & Sons, 568-569 (1998)) cannot be applied to increase the throughput of RSSE. Therefore, the maximum throughput of RSSE is potentially significantly lower than of MLSE. Furthermore, the throughput of RSSE depends on the channel memory such that it decreases for increasing L. FIG. 6 summarizes the comparison of MLSE and RSSE in terms of computational complexity and critical path.

Pipelined RSSE

It was suggested in E. F. Haratsch and K. Azadet, "High-speed reduced-state sequence estimation," Proc. IEEE Int. Symp. Circuits and Systems, May 2000, to precompute the branch metrics for all possible $2^L$ channel states $\rho_n$ in a look-ahead fashion outside the critical loop. At each decoding step, the appropriate branch metrics are chosen based on past survivor symbols in the SMU. This approach removes the BMU and DFU out of the critical loop. However, the hardware increases exponentially with the channel memory L. Also the delay through the MUXs, which select the actual branch metrics among all precomputed ones, increases with L, eventually neutralizing the speed gain achieved by the precomputation. The present invention provides a technique that increases the throughput of RSSE by performing pre-computations while only leading to a linear increase in hardware with respect to the look-ahead depth.

One-Step Look-Ahead

The hardware increase can be limited by taking advantage of past survivor symbols in the SMU and past decisions of the ACSU. This will be shown for precomputations with look-ahead depth one, i.e. possible values for branch metrics needed by the ACSU at time n are already computed at time n-1.

A partial decision-feedback for reduced state $\rho'_n$ could be calculated by using the L-1 survivor symbols $\hat{a}_{n-2}(\rho'_{n-1})$, $\hat{a}_{n-2}(\rho'_{n-1})$) corresponding to the survivor sequence into $\rho'_{n-1}$:

$$v_n(\rho'_{n-1}) = -\Sigma_{i=2}^{L} f_i \hat{a}_{n-i}(\rho'_{n-1}). \quad (12)$$

Note, that the K survivor symbols ($\hat{a}_{n-3}(\rho'_{n-1})$, $\hat{a}_{n-3}(\rho'_{n-1})$) need not to be fed back from the SMU, as they are equal to the symbols defining the state $\rho'_{n-1}$ (c.f. equation (6)). Therefore, these symbols and their contribution to the partial decision-feedback $v_n(\rho'_{n-1})$ are fixed for a particular state $\rho'_{n-1}$.

If $\tilde{a}_{n-1}$ denotes a possible extension of the sequence ($\hat{a}_{n-2}(\rho'_{n-1})$, $\hat{a}_{n-L(\rho'_{n-1})}$) the corresponding tentative decision-feedback is given by $$\tilde{u}_n(\rho_{n-1}, \tilde{a}_{n-1}) = v_n(\rho'_{n-1}) - f_1 \tilde{a}_{n-1}, \quad (13)$$

and the tentative branch metric under input $a_n$ is $$\tilde{\lambda}_n(z_n, a_n, \rho'_{n-1}, \tilde{a}_{n-1}) = (z_n - a_n + \tilde{u}_n(\rho'_{n-1}, \tilde{a}_{n-1}))^2. \quad (14)$$

The actual branch metric corresponding to survivor paths into state $\rho'_n$ and input an can be selected among the tentative branch metrics based on the past decision $d_{n-1}(\rho'_{n-1} = \rho'_n)$ according to $$\lambda'_n(z_n, a_n, \rho'_n) = sel(\Lambda_n(z_n, a_n, \rho'_n), d_{n-1}(\rho'_{n-1} = \rho'_n)), \quad (15)$$

where $\Lambda_n(z_n, a_n, \rho'_n)$ is the vector containing the two tentative branch metrics $\tilde{\lambda}'_n(z_n, a_n, \rho'_{n-}, a_{n-})$ for input $a_n$ and the two possible sequences into $\rho'_n$ from the different predecessor states $\{\rho'_{n-1}\}$:

$$\Lambda_n(z_n, a_n, \rho'_n) = \{\tilde{\lambda}(z_n, a_n, \rho'_{n-1}, \tilde{a}_{n-1})\}, \{\rho'_{n-1}\} \rightarrow \rho'_n. \quad (16)$$

Figure 8:
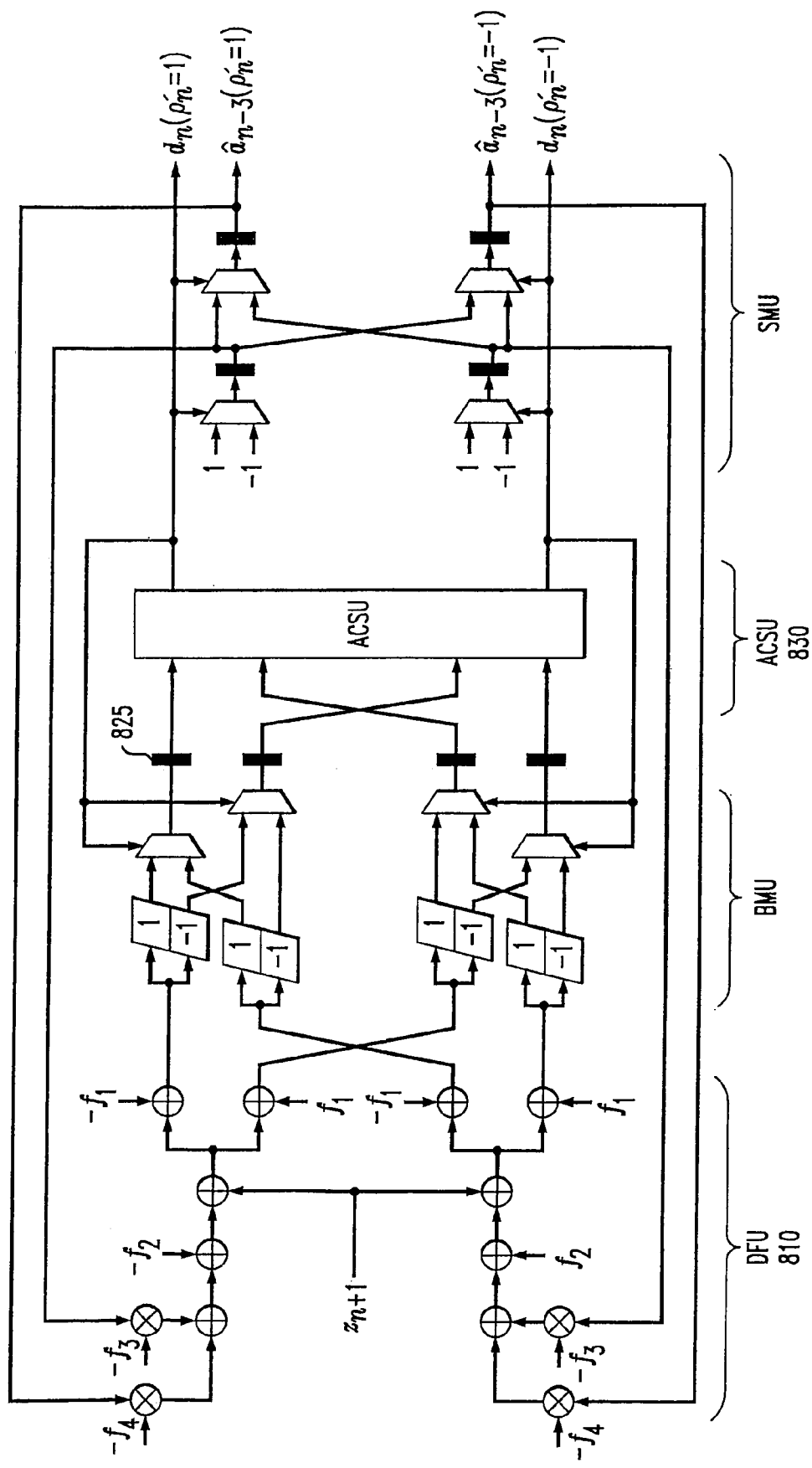
FIG. 8 illustrates an exemplary look-ahead architecture for an RSSE algorithm with one-step look-ahead in accordance with one embodiment of the present invention.

The branch metrics, which have been selected using equation (15), are used for the ACS operation according to equation (11). As equations (12), (13), (14), (15) and (16) can already be evaluated at time n-1, they are decoupled from the ACS operation according to equation (11) at time n. This leads to an architecture that can achieve a potentially higher throughput than the conventional RSSE implementation. The look-ahead architecture for the RSSE 700 of FIG. 7 (i.e. L=4 and K=1) is shown in FIG. 8. It can be seen that the long critical path in the architecture of FIG. 7 is broken up into two smaller critical paths, as a pipeline stage 825 is placed in front of the ACSU 830. The processing speed of this architecture still depends on the channel memory, as the number of additions and thus the delay along the critical path in the DFU 810 increases with L. In the following, a pipelined RSSE architecture is discussed whose maximum throughput does not depend on L.

Multiple-Step Look-Ahead

The process of precomputing branch metrics which are needed at time n could already be started at time n-M, where $M \in [1; L-K]$. A partial decision-feedback corresponding to the survivor sequence ($\hat{a}_{n-M-1}(\rho'_{n-M}), \hat{a}_{n-M-2}(\rho'_{n-M}), \ldots, \hat{a}_{n-L}(\rho'_{n-M})$) into $\rho'_{n-M}$ is given by $$v_n(\rho'_{n-M}) = -\Sigma_{i=M+1}^{L} f_i \hat{a}_{n-1}(\rho'_{n-M}). \quad (17)$$

It is again noted that the K survivor symbols ($\hat{a}_{n-M-1}(\rho'_{n-M}), \hat{a}_{n-M-2}(\rho'_{n-M}), \ldots \hat{a}_{n-m-k}(\rho'_{n-m})$) are identical to the symbols defining the state $\rho'_{n-M}$, and thus their contribution to $v_n(\rho'_{n-M})$ is fixed for this particular state. A tentative partial decision-feedback for a sequence starting with ($\hat{a}_{n-M-1}$ $(\rho'_{n-M}), \hat{a}_{n-M-2}(\rho'_{n-M}), \ldots, \hat{a}_{n-L}(\rho'_{n-M}))$ and which is extended by $\tilde{a}_{n-M}$ can be precomputed as $$\tilde{u}_n(\rho'_{n-M}, \tilde{a}_{n-M}) = v_n(\rho'_{n-M}) - f_M \tilde{a}_{n-M}. \quad (18)$$

When the decision $d_{n-M}(\rho'_{n-M} = \rho'_{n-M+1})$ becomes available, the partial decision-feedback, which corresponds to the survivor sequence $(\hat{a}_{n-M}(\rho'_{n-}), \hat{a}_{n-M-1}(\rho'_{n-M+1}), \ldots, \hat{a}_{n-L}(\rho'_{n-M+1}))$ can be selected among the precomputed ones:

$$v_n(\rho'_{n-M+1}) = sel(U_n(\rho'_{n-M+1}), d_{n-M}(\rho'_{n-M} = \rho'_{n-M+1})), \quad (19)$$

where $U_n(\rho'_{n-M+1})$ is the vector containing the two precomputed tentative partial decision-feedback values for the two possible path extensions into $\rho'_{n-M+1}$ from the different predecessor states $\{\rho'_{n-M}\}$ $$U_n(\rho'_{n-M+1}) = \{\tilde{u}_n(\rho'_{n-M}, \tilde{a}_{n-M})\}, \{\rho'_{n-M}\} \to \rho_{n-M+1}. \quad (20)$$

To be able to eventually precompute tentative branch metrics according to equation (14), the computations described by equations (18), (19) and (20) must be repeated for time steps n−M+1 to n−1 according to the following equations, where M−1 ≥ k ≥ 1:

$$\tilde{u}_n(\rho'_{n-k}, \tilde{a}_{n-k}) = v_n(\rho'_{n-k}) - f_k \tilde{a}_{n-k}, \quad (21)$$

$$v_n(\rho'_{n-k+1}) =$$

$$sel(U_n(\rho'_{n-k+1}), d_{n-k}(\rho'_{n-k} = \rho'_{n-k+1})), \quad (22)$$

$$U_n(\rho'_{n-k+1}) = \{\tilde{u}_n(\rho'_{n-k}, \tilde{a}_{n-k})\}, \{\rho'_{n-k}\} \to \rho'_{n-k+1}. \quad (23)$$

Once $\tilde{u}_n(\rho'_{n-1}, \tilde{a}_{n-1})$ becomes available, tentative branch metrics $\lambda_{n, \rho'_{n-1}, \tilde{u}_{n-1}}$ can be precomputed according to equation (14) and the appropriate branch metrics are selected according to equations (15) and (16).

Figure 9:
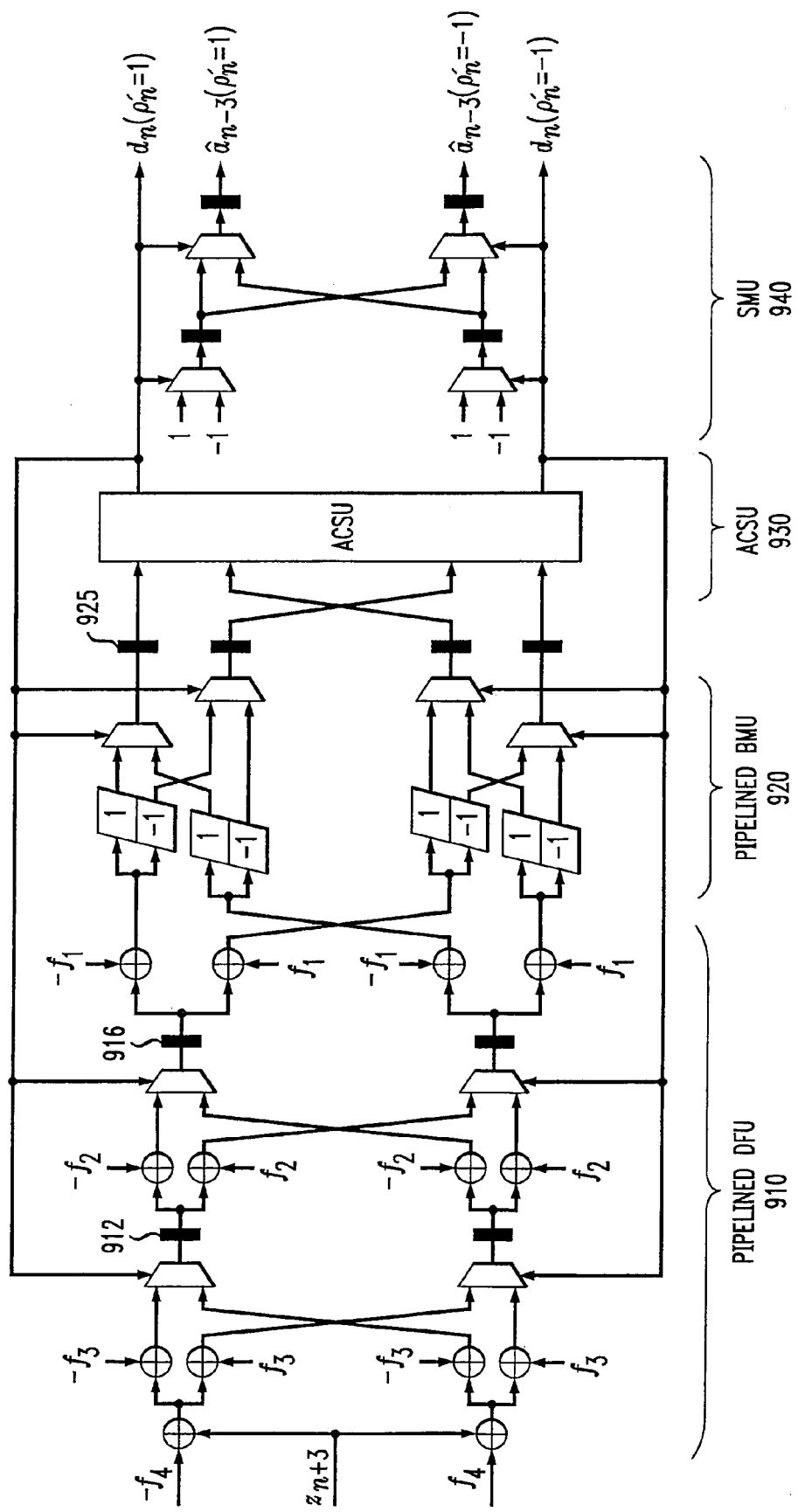
FIG. 9 illustrates an exemplary look-ahead architecture for an RSSE algorithm with multiple-step look-ahead in accordance with another embodiment of the present invention.

The architecture for RSSE 900 with look-ahead depth M=3 and the parameters L=4 and K=1 is shown in FIG. 9. It can be seen that in total M=3 pipeline stages are available. Two pipeline stages 912, 916 have been placed inside the DFU 910, and one pipeline stage 925 has been placed between the BMU 920 and ACSU 930. The connection network in the DFU 910 resembles the structure of the underlying trellis from FIG. 3, as past decisions from the ACSU 930 are used to extend the partial survivor sequences by the subsequent survivor symbol. As the LUT typically has a delay comparable to an adder, the critical path of this implementation is determined by an add-compare in the ACSU 930 (2 ADDs) and the storage of the most recent decision in the SMU 940 or the selection of an appropriate value with a 2-to-1 MUX in the DFU 910 or BMU 920.

The complexity and critical path of pipelined RSSE using multiple-step look-ahead computations is shown in FIG. 10. It can be seen in FIG. 10 that the hardware overhead for performing precomputations scales only linearly with the look-ahead depth M. Choosing M=L−K as in FIG. 9 leads to an architecture where the critical path is reduced to be of the same order as in MLSE (c.f. FIG. 6) and does not depend on the channel memory L. In a further variation, the precomputed partial ISI estimates in the pipelined DFU 910 may be processed in groups of taps, with a precomputation for all possible data symbol combinations corresponding to the groups of taps and selection for each group, as would be apparent to a person of ordinary skill in the art.

Figure 11:
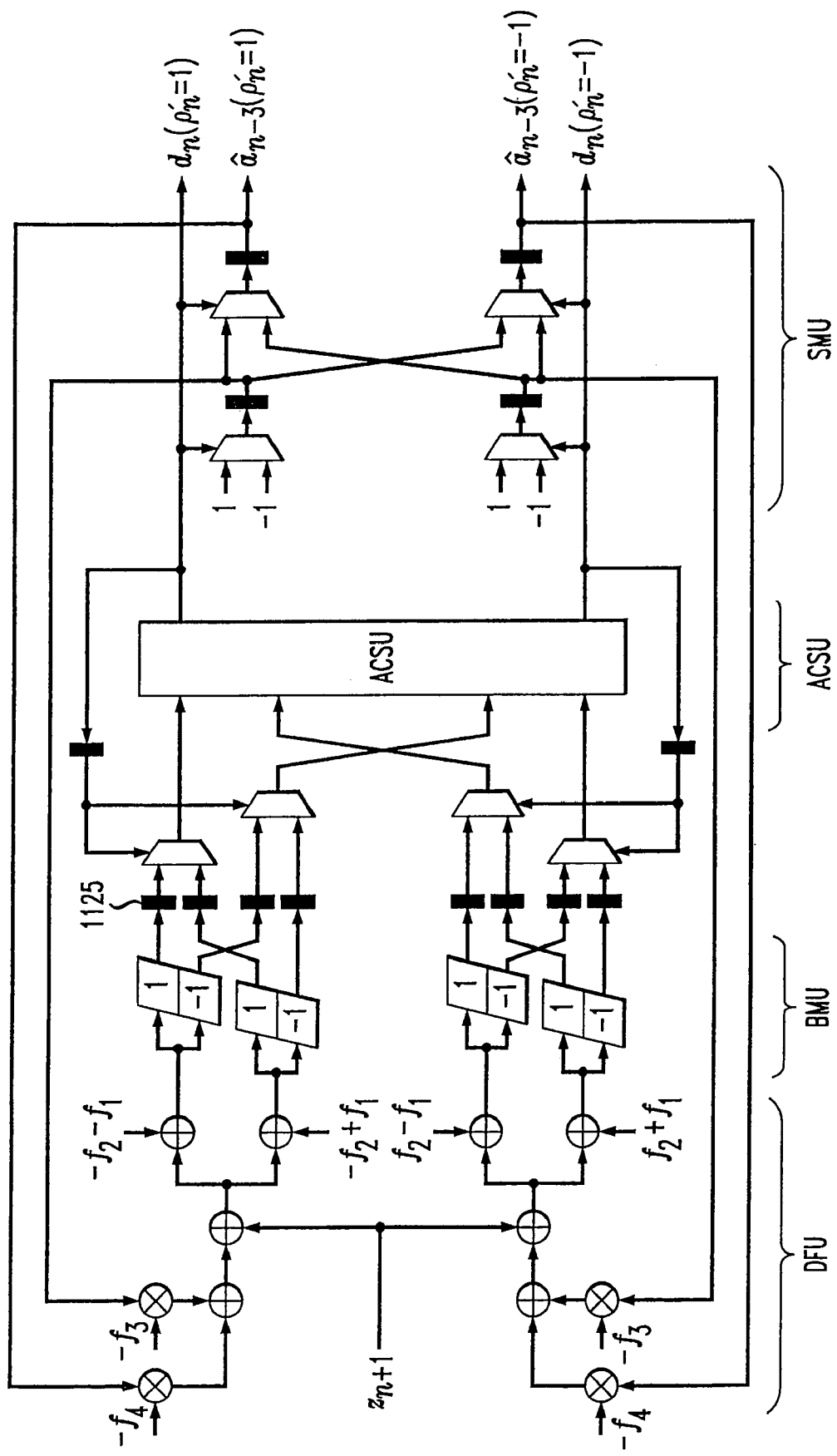
FIGS. 11 and 12 illustrate alternate implementations of the RSSE algorithms with one-step look-ahead (FIG. 8) and multiple-step look-ahead (FIG. 9), respectively.
Figure 12:
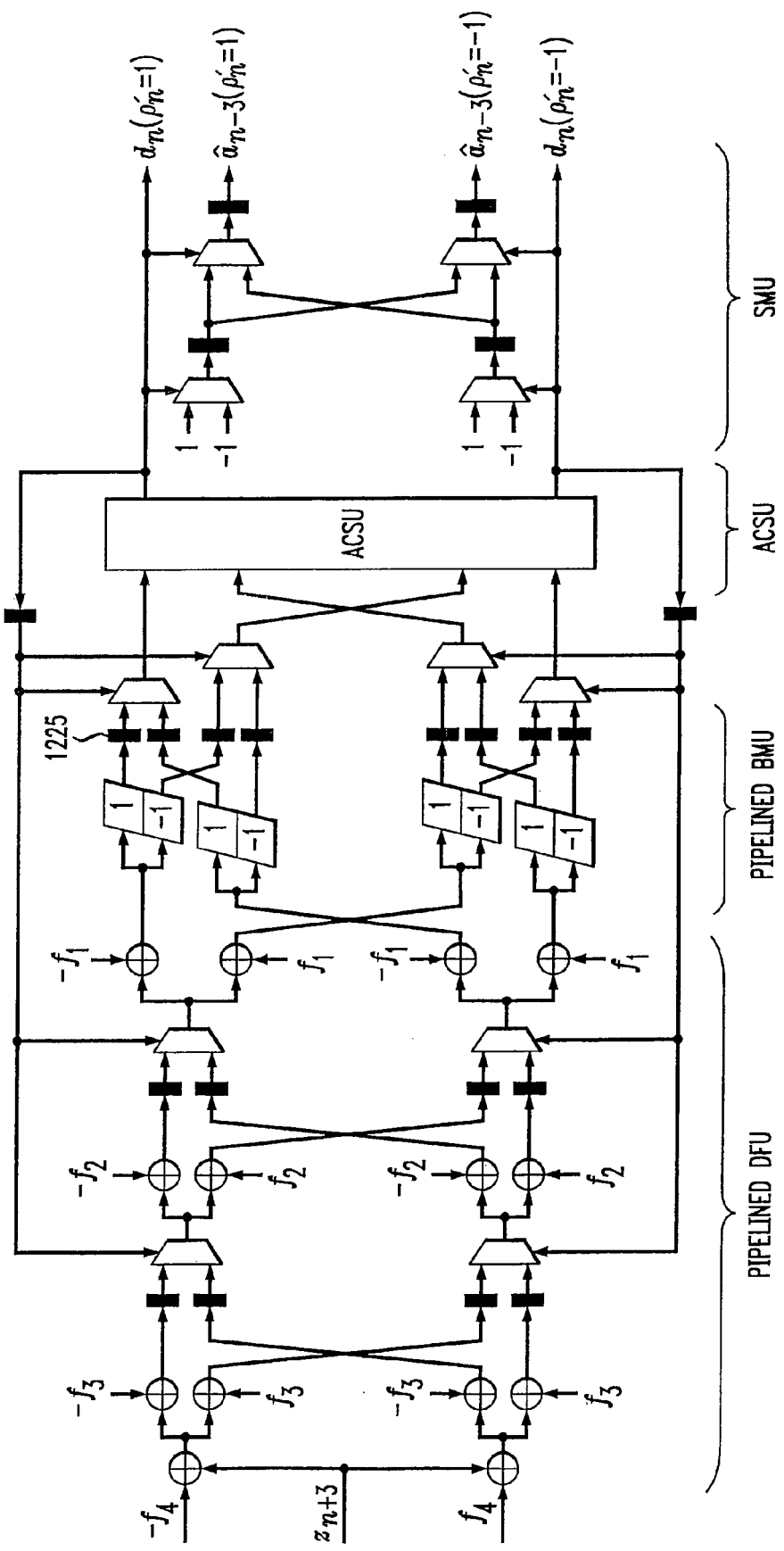

FIGS. 11 and 12 illustrate alternate implementations of the RSSEs shown in FIGS. 8 and 9, respectively, where pipeline registers are placed differently (now before Mux at stage 1125 and 1225, respectively) using a cut-set or re-timing transformation technique. For a more detailed discussion of cut-set or re-timing transformation techniques, see P. Pirsch, Architectures for Digital Signal Processing, New York, Wiley (1998), incorporated by reference herein. The present invention encompasses all derivations that can be achieved using such transformations, as would be apparent to a person of ordinary skill in the art.

Joint Postcursor Equalization and Trellis Decoding for 1000Base-T Gigabit Ethernet An exemplary embodiment employs the 1000BASE-T physical layer standard that specifies Gigabit Ethernet over four pairs of Category 5 unshielded twisted pair (UTP) copper cabling, as described in M. Hatamian et al., "Design Considerations for Gigabit Ethernet 1000Base-T Twisted Pair Transceivers," Proc. IEEE Custom Integrated Circuits Conf. (CICC), Santa Clara, Calif., 335-342 (May 1998); or K. Azadet, "Gigabit Ethernet Over Unshielded Twisted Pair Cables," Proc. Int. Symp. VLSI Technology, Systems, Applications (VLSI-TSA), Taipei, 167-170 (June 1999). It is noted that hereinafter, all variables will be defined in a new way. Although the meaning of variables used in this second part of this detailed description may be related to the definition of the variables in the previous part of the description, they might not exactly have the same meaning. All variables used hereinafter, however, will be described and defined in a precise way and their meaning is valid for this second part of the detailed description only.

The throughput of 1 Gb/s is achieved in 1000BASET by full duplex transmission of pulse amplitude modulated signals with the five levels $\{-2, -1, 0, 1, 2\}$ (PAM5) resulting in a data rate of 250 Mb/s per wire pair. By grouping four PAM5 symbols transmitted over the four different wire channels, a four-dimensional (4D) symbol is formed which carries eight information bits.

Thus, the symbol rate is 125 Mbaud/s, which corresponds to a symbol period of 8 ns. To achieve a target bit error rate of at less than $10^{-10}$, the digital signal processor (DSP) section of a 1000BASE-T receiver must cancel intersymbol interference (ISI), echo and near-end crosstalk (NEXT). 1000BASE-T improves the noise margin by employing trellis-coded modulation (TCM). For a detailed discussion of trellis-coded modulation techniques, see, for example, G. Ungerboeck, "Trellis-Coded Modulation With Redundant Signal Sets, Parts I and II," IEEE Commun. Mag., Vol. 25, 5-21 (February 1987), incorporated by reference herein.

Figure 13:
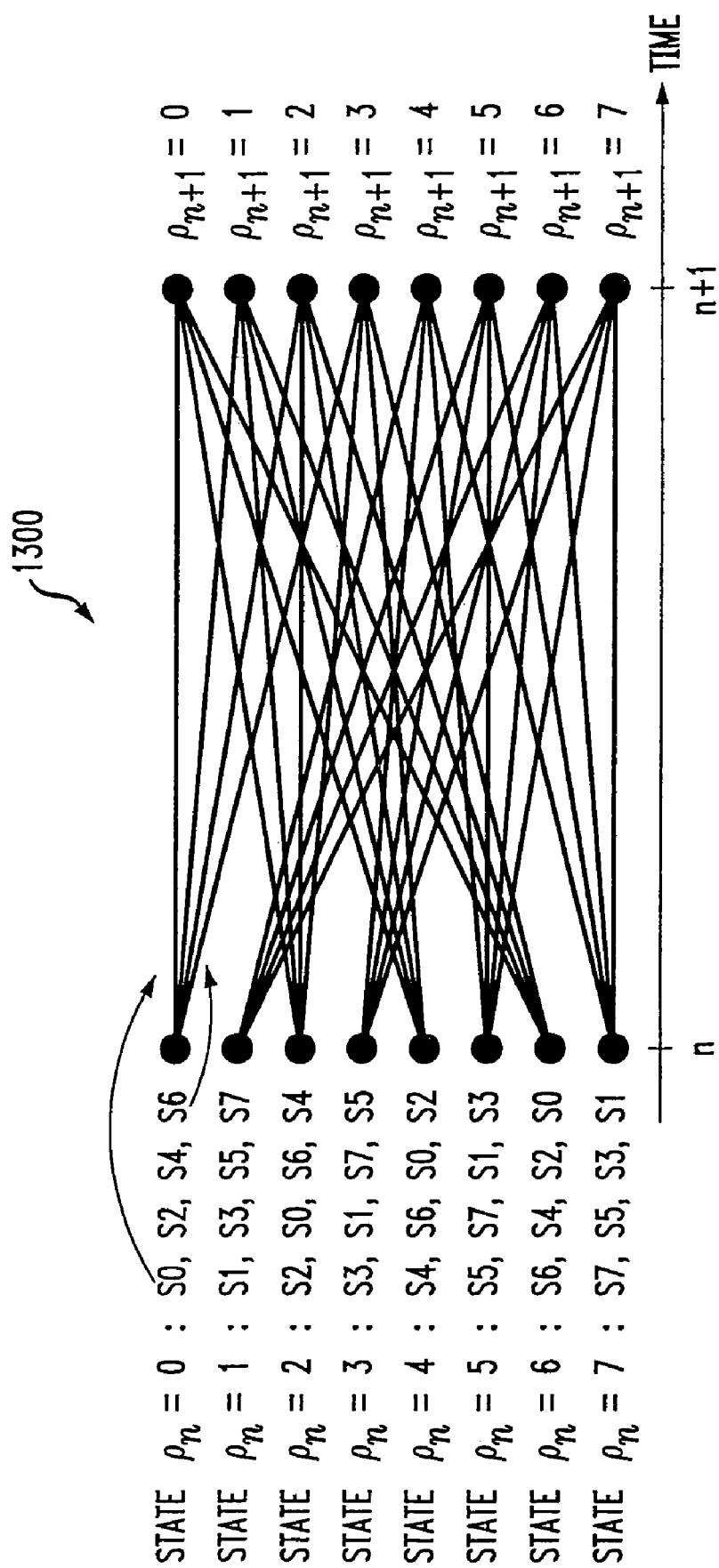
FIG. 13 illustrates a trellis for a multi-dimensional trellis code, such as the 1000BASE-T trellis code.

For coding purposes, the 1D PAM5 symbols are partitioned into two one dimensional (1D) subsets $A=\{-1, 1\}$ and $B=\{-2, 0, 2\}$. By grouping different combinations of the 1D subsets together which are transmitted over the four wire pairs, the eight 4D subsets S0, S1, . . . , S8 are formed. The 8-state, radix-4 code trellis specified by 1000BASE-T is shown in FIG. 13. $\rho_n$ in FIG. 13 denotes the state of the trellis code at time n (i.e., $\rho_n$ is no longer defined by equation (2), as noted at the beginning of this section). Each transition in the trellis diagram 1300 corresponds to one of the specified eight 4D subsets. There are 64 parallel transitions per state transition. Due to the 4D subset partitioning and labeling of the transitions in the code trellis, the minimum Euclidean distance between allowed sequences is $\Delta^2=4$ which corresponds to an asymptotic coding gain of 6 dB (10log4) over uncoded PAM5 in an ISI free channel.

In a 1000BASE-T receiver, feedforward equalizers, echo and NEXT cancellers remove precursor ISI, echo and NEXT respectively. The remaining DSP processing removes the postcursor ISI, which typically spans 14 symbol periods, and decodes the trellis code. It has been shown in E. F. Haratsch, "High-Speed VLSI Implementation of Reduced Complexity Sequence Estimation Algorithms With Application to Gigabit Ethernet 1000BASE-T," Proc. Int. Symp. VLSI Technology, Systems, Applications (VLSI-TSA), Taipei, 171-174 (June 1999) that parallel decision-feedback decoding, a special case of reduce-state sequence estimation, M. V. Eyuboglu and S. U. Qureshi, "Reduced-State Sequence Estimation for Coded Modulation on Intersymbol Interference Channels," IEEE J. Sel. Areas Commun., Vol. 7, 989-95 (August 1989), offers the best trade-off for this task with respect to SNR performance, hardware complexity and critical path. However, the integration of a 125 MHz, 14-tap parallel decision-feedback decoder (PDFD) is quite challenging because of the critical path problem.

A simplified postcursor equalization and trellis decoding structure was presented in E. F. Haratsch and K. Azadet, "A Low Complexity Joint Equalizer and Decoder for 1000BASE-T Gigabit Ethernet," Proc. IEEE Custom Integrated Circuits Conf. (CICC), Orlando, 465-68 (May 2000), where decision-feedback prefilters shorten the postcursor impulse response to one postcursor. Then exhaustive precomputation of all possible 1D branch metrics is possible, substantially reducing the critical path of the remaining 1-tap PDFD. However, the postcursor equalization and trellis decoding structure suffers from a performance degradation of 1.3 dB compared to a 14-tap PDFD.

The present invention thus provides a pipelined 14-tap PDFD architecture, which operates at the required processing speed of 125 MHz without any coding gain loss. To achieve this, the look-ahead technique discussed above for uncoded signals impaired by ISI, where the underlying trellis has no parallel state transitions, is extended to trellis codes with parallel transitions like the one specified in 1000BASE-T. The processing blocks of the disclosed architecture, which differ from a conventional PDFD design, are described below.

Parallel Decision-Feedback Decoding Algorithm

Parallel decision-feedback decoding combines postcursor equalization with TCM decoding by computing separate ISI estimates for each code state before applying the well known Viterbi algorithm (see, e.g., G. D. Forney, Jr., "The Viterbi Algorithm," Proc. IEEE, Vol. 61, 268-78 (March 1973)) to decode the trellis code. An ISI estimate for wire pair j and code state $\rho_n$ at time n is given by $$u_{n,j}(\rho_n) = \Sigma_{i=1}^{14} f_{i,j} \hat{a}_{n-i,j}(\rho_n),$$

where $\{f_{i,j}\}$ are the postcursor channel coefficients for wire pair j and $\hat{a}_{n-i,j}(\rho_n)$ is the j-th dimension of the 4D survivor symbol $\hat{a}_{n-i}(\rho_n) = (\hat{a}_{n-i,1}(\rho_n), \hat{a}_{n-i,2}(\rho_n), \hat{a}_{n-i,3}(\rho_n), \hat{a}_{n-i,4}(\rho_n))$, (which belongs to the survivor sequence into $\rho_n$ and corresponds to time n−i. As there are eight code states and four wire pairs, 32 ISI estimates are calculated at each decoding step. In a straight-forward PDFD implementation, the calculation of the ISI estimates in the decision-feedback unit introduces a recursive loop, which also includes the branch metric unit (BMU), add-compare-select unit (ACSU) and survivor memory unit (SMU). As the clock rate is 125 MHz in 1000BASE-T, there are only 8 ns available for the operations along this critical path. As conventional pipelining techniques cannot be applied to improve throughput due to the recursive nonlinear structure of this loop, it is extremely challenging to implement a 125 MHz, 14-tap PDFD for 1000BASE-T Gigabit Ethernet. When a state-parallel 14-tap PDFD is implemented using VHDL and synthesis in 3.3V 0.16 μm standard cell CMOS process, the design would only achieve a throughput of approximately 500 Mb/s, and the hardware complexity would be 158kGates. In the following, a pipelined 14-tap PDFD architecture is disclosed that achieves the required throughput of 1 Gb/s without sacrificing coding gain performance.

Pipelined 14-Tap PDFD Architecture

The parallel decision-feedback decoding algorithm was reformulated above such that pipelining of the computation of the ISI estimates and branch metrics is possible. ISI estimates and branch metrics are precomputed in a look-ahead fashion to bring the DFU and BMU out of the critical loop (see FIGS. 8 and 9 and corresponding discussion). Using ACS decisions to prune the look-head computation tree mitigates the exponential growth of the computational complexity with respect to the look-ahead depth. The above discussion only addressed the case where parallel decision-feedback decoding or other RSSE variants are used for equalization (and trellis decoding) of signals impaired by ISI, where the underlying trellis has no parallel state transitions.

In the following discussion, the look-ahead computation concept discussed above is extended to systems where the parallel decision-feedback decoding algorithm or other RSSE variants are used for equalization and/or trellis decoding where the underlying trellis has parallel state transitions. In particular, an exemplary pipelined, 14-tap PDFD architecture with look-ahead depth two is presented which meets the throughput requirement of 1000BASE-T. The present invention can be generalized to other look-ahead depths, trellis codes, modulation schemes, RSSE variants and number of postcursor taps, as would be apparent to a person of ordinary skill in the art.

Figure 14:
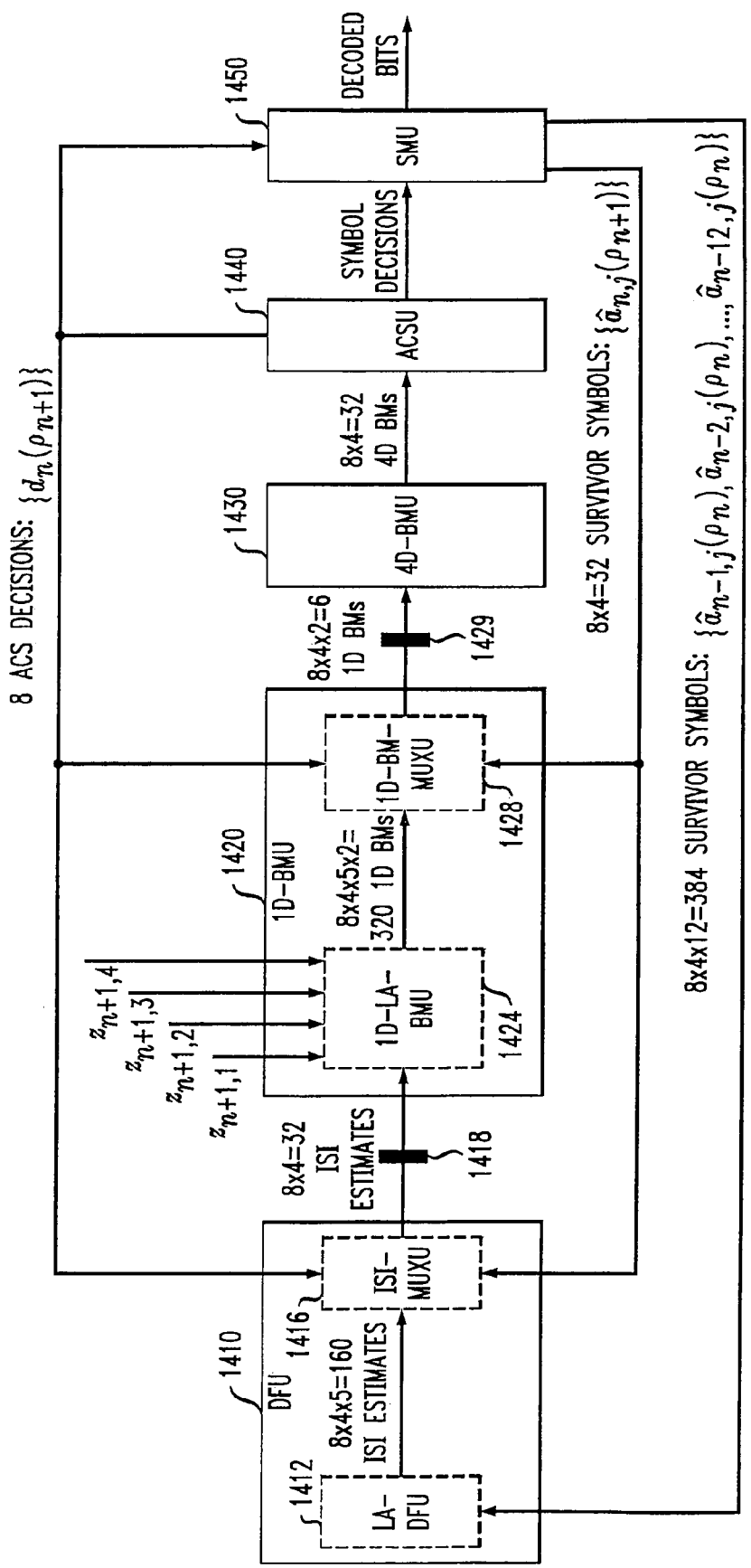
FIG. 14 is a schematic block diagram illustrating a pipelined parallel decision feedback decoder (PDFD) architecture that decodes the 1000BASE-T trellis code and equalizes intersymbol interference in accordance with the present invention.

The disclosed pipelined PDFD architecture, which decodes the 1000BASE-T trellis code and equalizes the ISI due to 14 postcursors is shown in FIG. 14. Speculative ISI estimates which are used for the ACS decisions corresponding to state transitions $\{\rho_{n+2}\} \rightarrow \{\rho_{n+3}\}$ are computed in the look-ahead DFU (LA-DFU) 1412 using information already available at time n, i.e., two clock cycles ahead of time. Therefore, the look-ahead depth is two. The appropriate ISI estimates are selected in the ISI-multiplexer unit (ISI-MUXU) 1416 based on ACS decisions (from 1440) and survivor symbols (from 1450). Speculative 1D branch metrics are precomputed one decoding step in advance in the 1D-LA-BMU 1424. Again, ACS decisions and survivor symbols are used to select the appropriate 1D branch metrics in the 1D-BM-MUXU 1428. The selected 1D branch metrics are added up in the 4D-BMU 1430 to compute the 4D branch metrics, which correspond to state transitions of the code trellis 1300 shown in FIG. 13. The best survivor path for each code state is determined in the ACSU 1440, and the eight survivor paths are stored in the SMU 1450.

Compared to a conventional PDFD implementation as described in E. F. Haratsch, "High-Speed VLSI Implementation of Reduced Complexity Sequence Estimation Algorithms With Application to Gigabit Ethernet 1000 Base-T," Int'l Symposium on VLSI Technology, Systems, and Applications, Taipei (June 1999), the DFU and 1D-BMU are outside the critical loop, as there is a pipeline stage 1418 between the DFU and 1D-BMU and another pipeline stage 1429 between the 1D-BMU and 4D-BMU. The critical path in the architecture of FIG. 14 includes only the 4D-BMU 1430, ACSU 1440 and SMU 1450. The contribution of the 1D-BM-MUXU 1428 and ISI-MUXU 1416 to the critical path is low. Therefore, the proposed PDFD architecture achieves a throughput twice as high as a conventional PDFD implementation. The proposed PDFD architecture differs from the pipelined structure developed for trellises without parallel state transitions in FIGS. 8 and 9 with respect to the selection of the appropriate ISI estimates and 1D branch metrics in the ISI-MUXU 1416 and 1D-BM-MUXU 1428. As 1000BASE-T employs TCM with parallel state transitions, not only ACS decisions, but also the most recent survivor symbols are required for the selection of the appropriate values as there is not a unique relationship between ACS decisions and survivor symbols. In the following, the implementation of the DFU 1410, 1D-BMU 1420 and SMU 1450 are described in detail. The implementation of the 4D-BMU 1430 and ACSU 1440 is the same as in a conventional PDFD and is already described in E. F. Haratsch and K. Azadet, "A Low Complexity Joint Equalizer and Decoder for 1000BASE-T Gigabit Ethernet," Proc. IEEE Custom Integrated Circuits Conf. (CICC), Orlando, 465-468 (May 2000).

Decision-Feedback Unit

Exhaustive precomputation of ISI estimates is not feasible in 1000BASE-T without prefiltering as the number of possible ISI estimates grows exponentially with the number of postcursors. As there are 14 postcursors, four wire pairs and PAM5 modulation is being used, there are in total $4 \times 5^{14} \approx 2 \times 10^{10}$ possible ISI estimates, which must be precomputed. Precomputing ISI estimates using a limited look-ahead depth reduces the complexity. The exponential growth of the number of precomputed ISI estimates is mitigated as the precomputation is not completely decoupled from the ACS and survivor symbol decisions. Survivor symbols available at time n are used for the computation of ISI estimates corresponding to state transitions $\{\rho_{n+2}\} \to \{\rho_{n+3}\}$. Then, the look-ahead computation tree is pruned using ACS and survivor symbol decisions available at time n.

Look-Ahead Computation of ISI Estimates (LA-DFU)

An estimate $v_{n+2,j}(\rho_n)$ for the partial ISI due to the channel coefficients $\{f_{3,j}, f_{4,j}, \ldots, f_{14,j}\}$ which corresponds to a state transition $\rho_{n+2} \to \rho_{n+3}$ can be calculated by using the symbols from the survivor path into state p, which are available at time n:

$$v_{n+2,j}(\rho_n) = -\Sigma_{i=1}^{12} f_{i+2,j} \hat{a}_{n-i,j}(\rho_n).$$

A speculative partial ISI estimate $\tilde{u}_{n+2,j}(\rho_n, \tilde{a}_{n,j})$, which also considers the ISI due to $f_{2,j}$ and assumes that $\tilde{a}_{n,j}$ is the 1D symbol for the corresponding transition $\rho_n \to \rho_{n+1}$ is calculated as $$\tilde{u}_{n+2,j}(\rho_n, \tilde{a}_{n,j}) = v_{n+2,j}(\rho_n) - f_{2,j} \tilde{a}_{n,j}.$$

Figure 15:
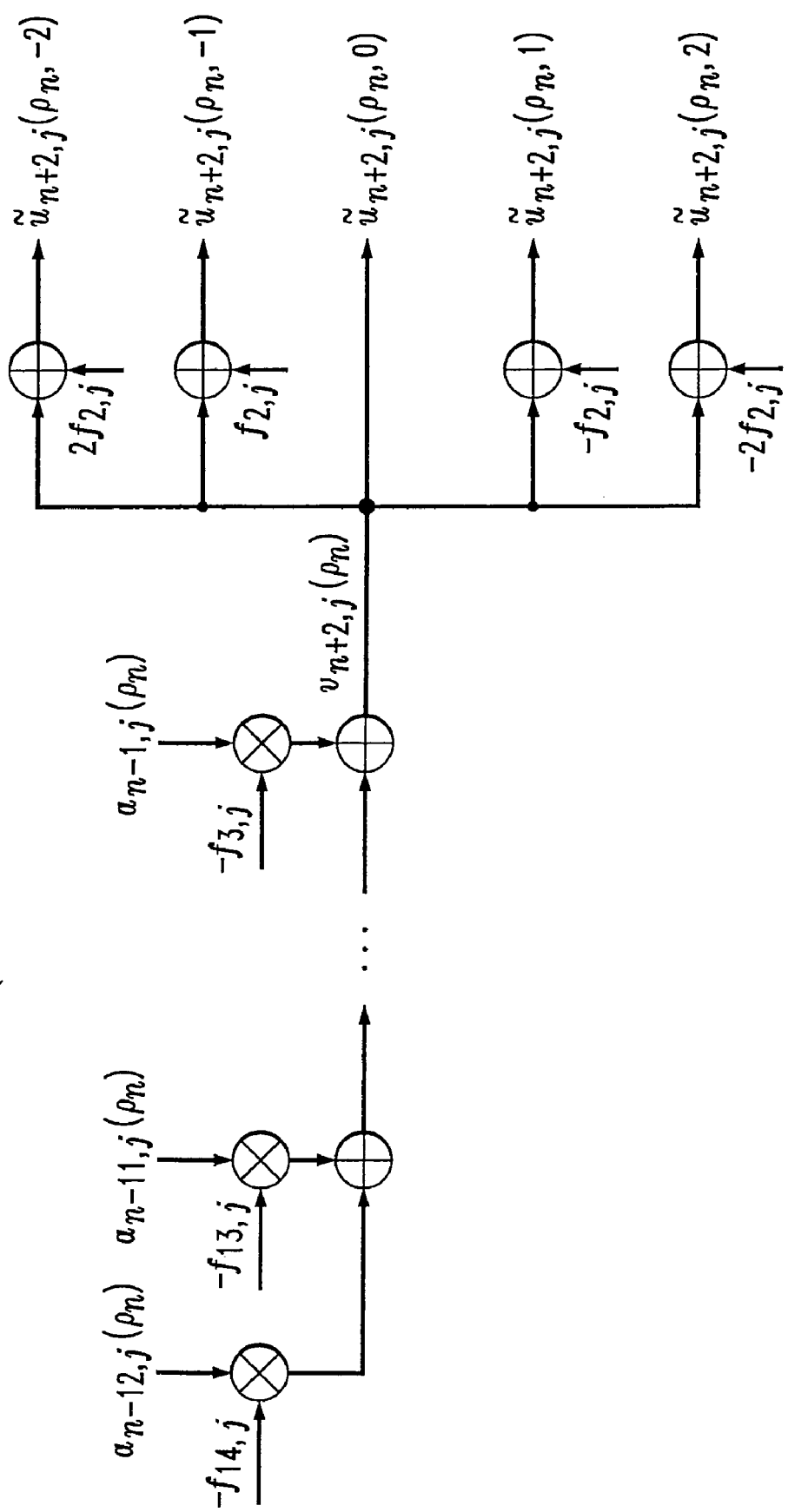
FIG. 15 is a schematic block diagram illustrating an embodiment of the look-ahead decision feedback unit (LA-DFU) of FIG. 14.

As there are five possibilities for $\tilde{a}_{n,j}$ due to the PAM5 modulation, five different partial ISI estimates must be computed per code state and wire pair in the LA-DFU 1412 as shown in FIG. 15. In total, 160 (8×4×5) such ISI estimates are precomputed in the LA-DFU 1412.

Selection of ISI Estimates (ISI-MUXU)

The appropriate partial ISI estimate $v_{f+2,j}(\rho_{n+j})$ which considers the symbols from the survivor path into $\rho_{n+1}$ and the channel coefficients $\{f_{2,j}, f_{3,j}, \ldots, f_{14,j}\}$ can be selected among the precomputed partial ISI estimates $\tilde{u}_{n+2,j}(\rho_n, \tilde{a}_{n,j})$ when the best survivor path into state $\rho_{n+1}$ and the corresponding 4D survivor symbol $\hat{a}_{n,j}(\rho_{n+1})$ become available.

Figure 16:
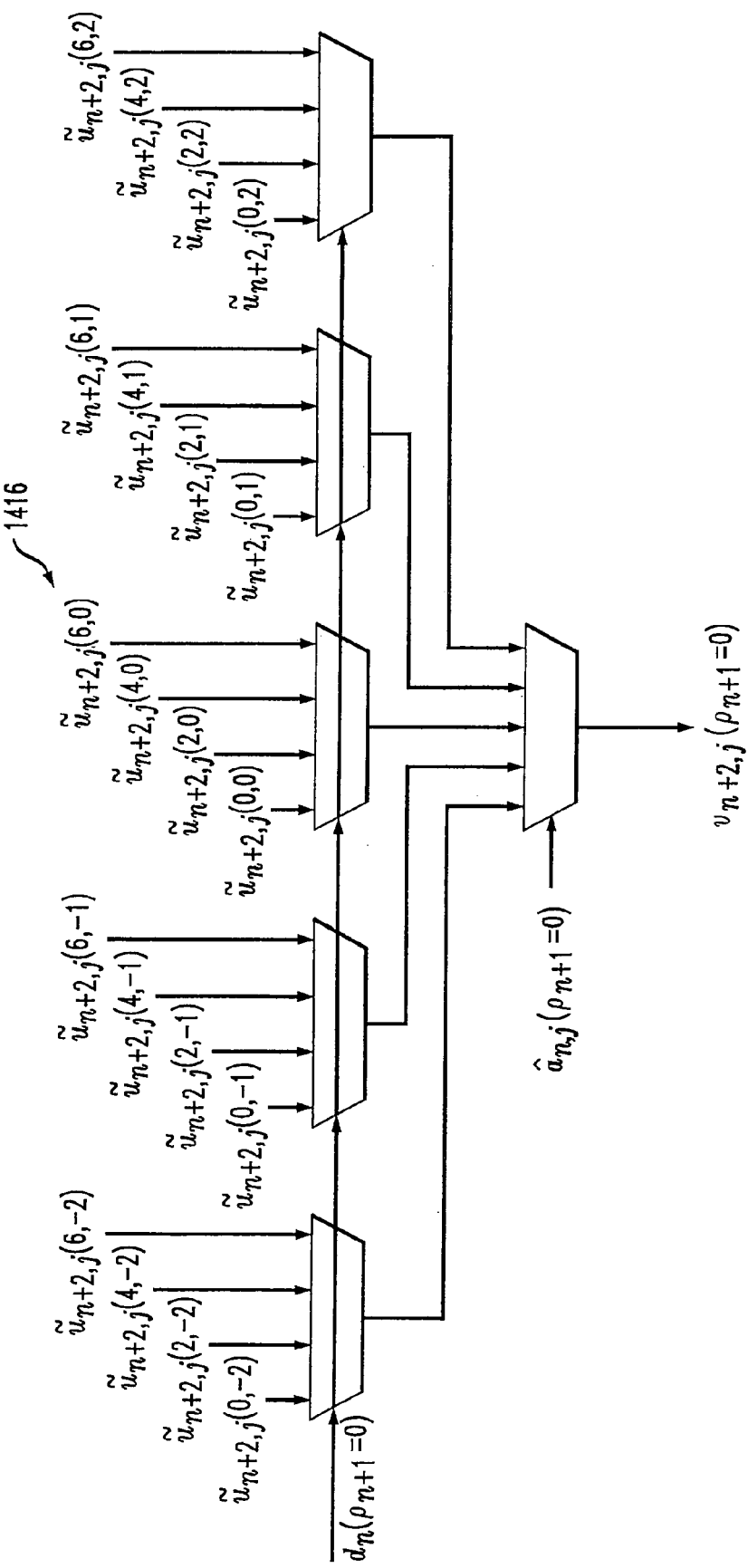
FIG. 16 is a schematic block diagram illustrating an embodiment of the intersymbol interference selection unit (ISI-MUXU) of FIG. 14.

This selection in the ISI-MUXU 1416 is shown in FIG. 16 for a particular wire pair j and state $\rho_{n+1}=0$. The partial ISI estimate $v_{n+2,j}(\rho_{n+1}=0)$ is selected among 20 (4×5) precomputed partial ISI estimates $\{\tilde{u}_{n+2,j}(\rho_n, \tilde{a}_{n,j})\}$, $\{\rho_n\} \to \rho_{n+1}=0$, as there are the four contender paths from the states $\rho_n=0,2,4$ and 6 leading into state $\rho_{n+1}=0$. Also, for each of these contender paths leading into state $\rho_{n+1}$, five different partial ISI estimates $\tilde{u}_{n+2,j}(\rho_n, \tilde{a}_{n,j})$ corresponding to different values for $\tilde{a}_{n,j}$ are possible. As shown in FIG. 16, the selection of the appropriate partial ISI estimate $v_{n+2,j}(\rho_{n+1})$ is performed in two stages. First, the ACS decision $d_n(\rho_{n+1})$ selects the five speculative partial ISI estimates, which correspond to the selected survivor path into $\rho_{n+1}$, but assume different values for $\tilde{a}_{n,j}$. Then, the survivor symbol $\hat{a}_{n,j}(\rho_{n+1})$ selects the appropriate partial ISI estimate $v_{n+2,j}(\rho_{n+1})$, which assumed $\hat{a}_{n,j}(\rho_{n+1})$ as value for $\tilde{a}_{n,j}$. Both $d_n(\rho_{n+1})$ and $\hat{a}_{n,j}(\rho_{n+1})$ become available at the end of the clock cycle corresponding to state transitions $\{\rho_n\} \to \{\Sigma_{n+1}\}$. The output of the ISI-MUXU is 32 (8×4) partial ISI estimates $v_{n+2,j}(\rho_{n+1})$, as there are eight states and four wire pairs.

1D Branch Metric Unit

The 1D-BMU 1420 consists of two processing blocks. The 1D-LA-BMU 1424 takes the partial ISI estimates $\{v_{n+1,j}(\rho_n)\}$ computed in the DFU to calculate speculative 1D branch metrics. In the 1D-BM-MUXU 1428, the appropriate 1D branch metrics are selected using ACS decisions and corresponding survivor symbols.

Look-Ahead Computation of 1D Branch Metrics (1D-LA-BMU)

The 1D-LA-BMU 1424 precomputes speculative 1D branch metrics which are then needed in the 4D-BMU 1430 one clock cycle later. Input into the 1D-LA-BMU 1424 are the partial ISI estimates $\{v_{n+1,j}(\rho_n)\}$, which correspond to trellis transitions $\{\rho_{n+1}\} \to \{\rho_{n+2}\}$. These ISI estimates consider the channel coefficients $\{f_{2,j}, f_{3,j}, \ldots, f_{14,j}\}$ and the symbols from the survivor path into state $\rho_n$. A speculative partial ISI estimate $\tilde{u}_{n+1,j}(\rho_n, \tilde{a}_{n,j})$ which also considers the ISI due to the channel coefficient $f_{1,j}$ and assumes that an, is the 1D symbol corresponding to the transition $\rho_n \to \rho_{n+1}$ is given by:

$$\tilde{u}_{n+1,j}(\rho_n, \tilde{a}_{n,j}) = v_{n+1,j}(\rho_n) - f_{1,j}\tilde{a}_{n,j}.$$

The speculative 1D branch metric for a transition from state $\rho_{n+1}$ under the symbol $a_{n+1,j}$ assuming that the corresponding survivor path contains the survivor sequence into state $\rho_n$ and is extended by the symbol $\tilde{a}_{n,j}$ to reach state $\rho_{n+1}$ is given by $$\tilde{\lambda}_{n+1,j}(z_{n+1,j}, a_{n+1,j}, \rho_n, \tilde{a}_{n,j}) = (z_{n+1,j} - a_{n+1,j} + \tilde{u}_{n+1,j}(\rho_n, \tilde{a}_{n,j}))^2.$$

Figure 17:
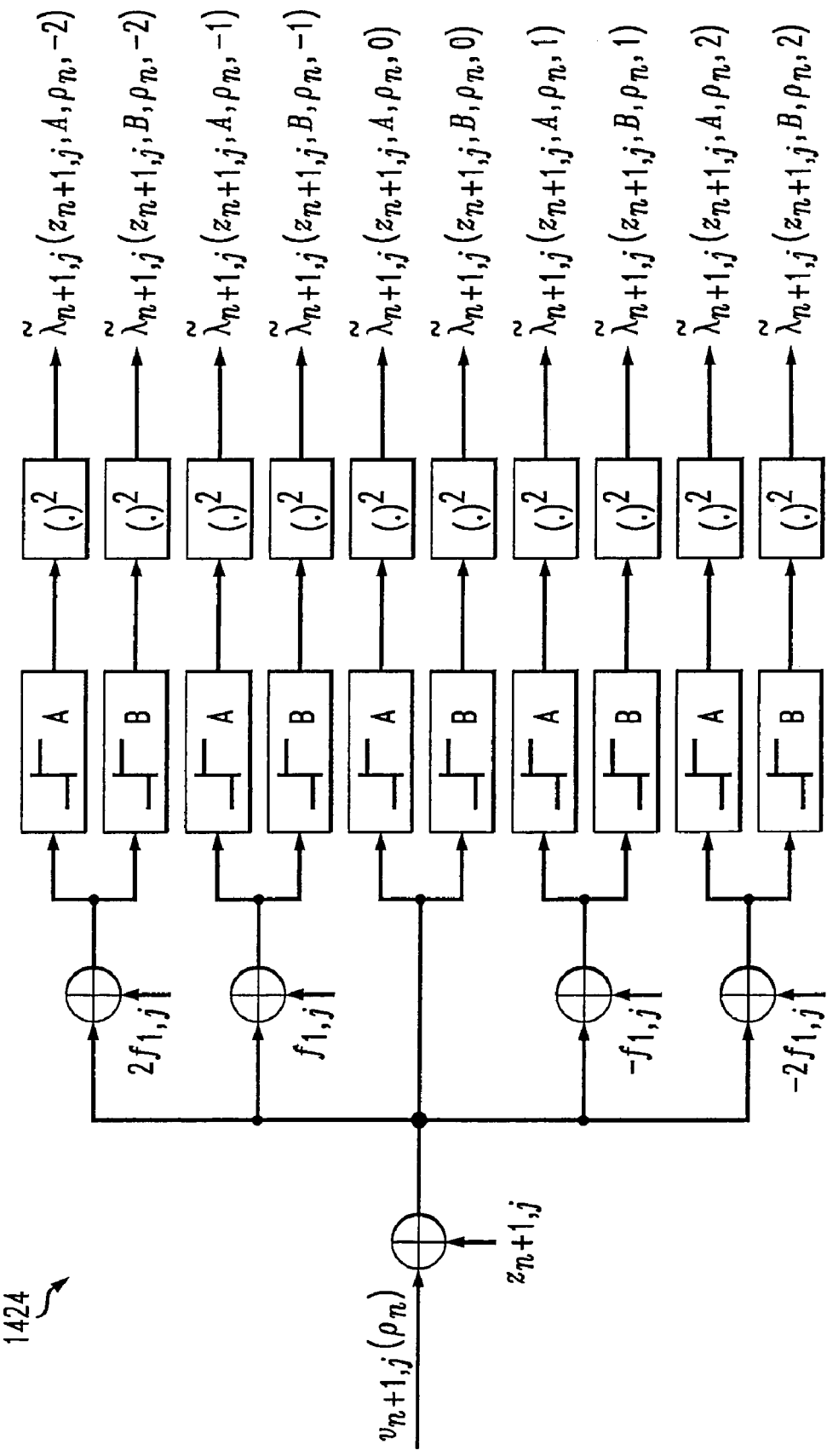
FIG. 17 is a schematic block diagram illustrating an embodiment of the one dimensional look-ahead branch metrics unit (1D-LA-BMU) of FIG. 14.

The precomputation of speculative 1D branch metrics for a particular initial state $\rho_n$ and wire pair j is shown in FIG. 17, where the slicers calculate the difference between the slicer input and the closest symbol in the 1D subsets A and B, respectively. As there are four wire pairs, eight code states, five possibilities for $\tilde{a}_{n,j}$ (due to the PAM5 modulation), and two possibilities for $a_{n+1,j}$ (A-type or B-type 1D symbol), in total 320 (8×4×5×2) different speculative 1D branch metrics are precomputed in the 1D-LA-BMU 1424.

Selection of 1D Branch Metrics (1D-BM-MUXU)

The appropriate 1D branch metric $\lambda_{n+1,j}(z_{n+1,j}, a_{n+1,j}, \rho_{n+1})$ which corresponds to a transition from state $\rho_{n+1}$ under the 1D symbol $a_{n+1,j}$ is selected among 4×5=20 precomputed 1D branch metrics $\tilde{\lambda}_{n+1,j}(z_{n+1,j}, a_{n+1,j}, \rho_{n,j})$ as there are four path extensions from different states $\{\rho_n\}$ into $\rho_{n+1}$ and five possibilities for $\tilde{a}_{n,j}$ due to the PAM5 modulation. The selection of a particular $\lambda_{n+1,j}(z_{n+1,j},a_{n+1,j},\rho_{n+1})$ in the 1D-BM-MUXU 1428 is performed using the same multiplexer structure as shown in FIG. 16. First, the ACS decision $d_n(\rho_{n+1})$ determines the five speculative 1D branch metrics, which correspond to the state on being part of the survivor path into $\rho_{n+1}$. Then, the survivor symbol $\hat{a}_{n,j}(\rho_{n+1})$ selects among these five metrics the one which assumed $\hat{a}_{n,j}(\rho_{n+1})$ as value for $\tilde{a}_{n,j}$. The 1D-BM-MUXU 1428 selects in total 64 (8×4×2) actual 1D branch metrics, as there are eight states, four wire pairs and the two 1D subset types A and B.

Survivor Memory Unit

Figure 18:
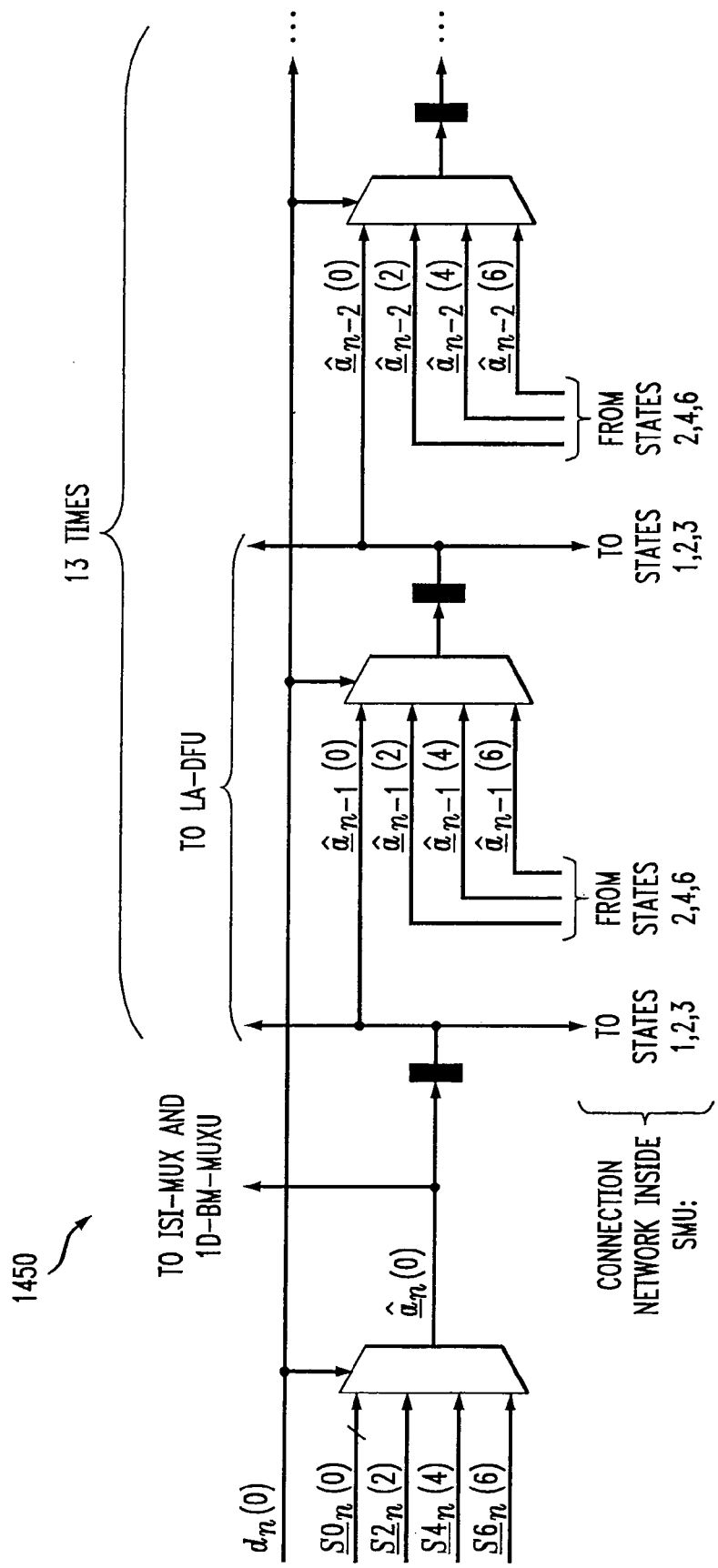
FIG. 18 is a schematic block diagram illustrating an embodiment of the survivor memory unit (SMU) of FIG. 14.

The merge depth of the exemplary 1000BASE-T trellis code is 14. The SMU must be implemented using the register-exchange architecture described in R. Cypher and C. B. Shung, "Generalized Trace-Back Techniques for Survivor Memory Management in the Viterbi Algorithm," J. VLSI Signal Processing, Vol. 5, 85-94 (1993), as the survivor symbols corresponding to the time steps n-12,n-11, . . . , n are needed in the DFU without delay and the latency budget specified in the 1000BASE-T standard is very tight. The proposed register-exchange architecture with merge depth 14 is shown in FIG. 18, where only the first row storing the survivor sequence corresponding to state zero is shown. $\underline{SX}_n(\rho_n)$ denotes the 4D symbol decision corresponding to 4D subset SX and a transition from state $\rho_n$. The multiplexers in the first column select the 4D survivor symbols $\{\hat{a}_n(\rho_{n+1})\}$, which are part of the survivor path into $\{\rho_{n+1}\}$. These 4D survivor symbols are required in the ISI-MUXU 1416 and 1D-BM-MUXU 1428 to select the appropriate partial ISI estimates and 1D branch metrics, respectively. The survivor symbols $\{\hat{a}_{n-1}(\rho_n),\hat{a}_{n-2}(\rho_n), \ldots, \hat{a}_{n-12}(\rho_n)\}$ which are stored in the registers corresponding to the first, second, . . . 12th column are used in the LA-DFU 1412 to compute the partial ISI estimates $v_{n+2,j}(\rho_n)$.

It is to be understood that the embodiments and variations shown and described herein are merely illustrative of the principles of this invention and that various modifications may be implemented by those skilled in the art without departing from the scope and spirit of the invention.

We claim:

1. A method for processing a signal received from a dispersive channel using a reduced-state sequence estimation technique, said channel having a channel impulse response, said method comprising the steps of:
   precomputing partial intersymbol interference estimates for each of a plurality of postcursor taps of said channel impulse response, wherein said partial intersymbol interference estimates are based on each possible value for a data symbol;
   selecting a precomputed partial intersymbol interference estimate for each of said plurality of postcursor taps other than a first postcursor tap based on a past decision from a corresponding state, wherein a precomputed partial intersymbol interference estimate for a first postcursor tap is a precomputed inter symbol interference estimate;
   precomputing branch metrics based on said precomputed intersymbol interference estimate;
   selecting one of said precomputed branch metrics based on a past decision from a corresponding state;
   computing a new path metric for a path extension from a corresponding state based on said selected branch metrics; and
   determining a best survivor path into a state by selecting a path having a best new path metric among said corresponding computed new path metrics.

2. The method of claim 1, wherein said past decision from a corresponding state includes a survivor symbol.

3. The method of claim 1, wherein said past decision from a corresponding state includes an add-compare select decision.

4. The method of claim 1, wherein said step of precomputing partial intersymbol interference estimates for a given postcursor tap further comprises the step of combining (i) a partial intersymbol interference estimate for a previous postcursor tap, and (ii) a product of a channel coefficient value and a possible symbol value.

5. The method of claim 4, wherein said partial intersymbol interference estimate for a previous postcursor tap is a selected precomputed partial intersymbol interference estimate.

6. The method of claim 4, wherein said partial intersymbol interference estimate for a previous postcursor step is a non-speculative partial intersymbol interference estimate.

7. The method of claim 6, wherein said non-speculative partial intersymbol interference estimate is based on a past decision from a corresponding state.

8. The method of claim 6, wherein said non-speculative partial intersymbol interference estimate is based on a data symbol associated with a corresponding state.

9. The method of claim 1, wherein said reduced-state sequence estimation technique is selected from the group consisting essentially of (i) a decision-feedback sequence estimation technique; (ii) a delayed decision-feedback sequence estimation technique; or (iii) a parallel decision-feedback decoding technique.

10. The method of claim 1, wherein said method allows said reduced-state sequence estimation technique to be pipelined before or after each of said selections.

11. The method of claim 1, wherein said first selecting step comprises the step of selecting a precomputed partial intersymbol interference estimate for a group of said plurality of postcursor taps other than a first group of postcursors taps based on past decisions, wherein a precomputed partial intersymbol interference estimate for a first group of postcursor taps is a precomputed intersymbol interference estimate.

12. The method of claim 11, wherein said step of precomputing said partial intersymbol interference estimates for a given group of postcursor taps further comprises the step of combining a (i) partial intersymbol interference estimate for a previous group of postcursor taps, and (ii) a combination of products of channel coefficients and possible symbol values for each tap of said plurality of postcursor taps.

13. The method of claim 1, wherein said signal is a multi-dimensional signal, and transitions in a trellis processed by said reduced-state sequence estimation technique correspond to multi-dimensional symbols, wherein said steps of precomputing and selecting branch metrics comprise the steps of:
   precomputing one-dimensional branch metrics based on said precomputed intersymbol interference estimates;
   selecting one of said precomputed one-dimensional branch metric based on a past decision from a corresponding state; and
   combining said corresponding selected one-dimensional branch metrics to obtain a multi-dimensional branch metric.

14. The method of claim 1, wherein said signal is a multi-dimensional signal, and transitions in a trellis processed by said reduced-state sequence estimation technique correspond to multi-dimensional symbols, wherein said steps of precomputing and selecting branch metrics comprise the steps of:

precomputing one-dimensional branch metrics based on said precomputed intersymbol interference estimates;

combining said one-dimensional branch metric to precompute at least two-dimensional branch metrics; and selecting one of said precomputed at least two-dimensional branch metrics based on a past decision from a corresponding state.

15. The method of claim 14, wherein said selection of an appropriate at least two-dimensional branch metrics corresponding to a particular state is based on at least two-dimensional survivor symbols from a corresponding state.

16. A reduced-state sequence estimator for processing a signal received from a dispersive channel having a channel impulse response, comprising:

a decision feedback unit for precomputing partial intersymbol interference estimates for each of a plurality of postcursor taps of said channel impulse response, wherein said partial intersymbol interference estimates are based on each possible value for a data symbol;

a multiplexer for selecting a precomputed partial intersymbol interference estimate for each of said plurality of postcursor taps other than a first postcursor tap based on a past decision from a corresponding state, wherein a precomputed partial intersymbol interference estimate for a first postcursor tap is a precomputed intersymbol interference estimate;

a branch metrics unit for precomputing branch metrics based on said precomputed intersymbol interference estimate;

a multiplexer for selecting one of said precomputed branch metrics based on a past decision from a corresponding state;

an add-compare-select unit for computing a new path metric for a path extension from a corresponding state based on said selected branch metrics and determining a best survivor path into a state by selecting a path having a best new path metric among said corresponding computed new path metrics; and at least one set of pipeline registers to perform said reduced-state sequence estimation in at least two stages.

17. A reduced-state sequence estimator for processing a signal received from a dispersive channel having a channel impulse response, comprising:

a decision feedback unit from precomputing partial intersymbol interference estimates for each of a plurality of postcursor taps of said channel impulse response, wherein said precomputed partial intersymbol interference estimates are based on each possible value for a data symbol;

a multiplexer for selecting a precomputed partial intersymbol interference estimate for each of said plurality of postcursor taps based on a past decision from a corresponding state, wherein a selected partial intersymbol interference estimate for a first postcursor tap is a selected intersymbol interference estimate;

a branch metrics unit for computing a branch metric based on said selected intersymbol interference estimate;

a multiplexer for selecting one of said precomputed branch metrics based on a past decision from a corresponding state;

an add-compare-select unit for computing a new path metric for a path extension from a corresponding state based on said branch metric and determining a best survivor path into a state by selecting a path having a best new path metric among said corresponding computed new path metrics; and at least one set of pipeline registers to perform said reduced-state sequence estimation in at least two stages.

* * * * *

UNITED STATES PATENT AND TRADEMARK OFFICE
CERTIFICATE OF CORRECTION

PATENT NO. : 7,363,576 B2
APPLICATION NO. : 11/234446
DATED : April 22, 2008
INVENTOR(S) : Azadet et al.

It is certified that error appears in the above-identified patent and that said Letters Patent is hereby corrected as shown below:

In the drawings, Sheet 3, Fig. 6, the reference numeral 630 should be applied to the column summarizing the computational complexity and critical path of RSSE.

Sheet 5, Fig. 8, the reference numerical 820 should be applied to the BMU stage and reference numerical 840 should be applied to the SMU stage.

Sheet 8, Fig. 11, the reference numerical 1110 should be applied to the DFU stage, reference numerical 1120 should be applied to the BMU stage, reference numerical 1130 should be applied to the ACSU stage, and reference numerical 1140 should be applied to the SMU stage.

Sheet 9, Fig. 12, the reference numerical 1210 should be applied to the PIPELINED DFU stage, reference numerical 1220 should be applied to the PIPELINED BMU stage, reference numerical 1230 should be applied to the ACSU stage, and reference numerical 1240 should be applied to the SMU stage.

Sheet 11, Fig. 14, above reference numerical 1429, after "8×4×2=" replace "6" with -- 64 --.

In the specification, column 5, line 35, after "input" and before "is" replace "an" with -- $a_n$ --; line 46, after "where" and before "($\rho_n$)" replace "$\gamma_n$" with -- $\Gamma_n$ --.

Column 6, line 44, after "input" and before "is" replace "an" with -- $a_n$ --; line 49, the right hand side of the formula (9) should appear as follows:

$$\sum_{i=1}^{K} f_i a_{n-i} - \sum_{i=K+1}^{L} f_i \hat{a}_{n-i}(\rho'_n)$$

Column 6, line 62, before "($\rho'_{n+1}$)" replace "$\gamma'_{n+1}$" with -- $\Gamma''_{n+1}$ --.

Column 8, lines 5-6, after "symbols" and before "corresponding" replace

" $\hat{a}_{n-2}(\rho'_{n-1}), \hat{a}_{n-2}(\rho'_{n-1})\}$ " with

-- $\{\hat{a}_{n-2}(\rho'_{n-1}), \hat{a}_{n-3}(\rho'_{n-1}), ..., \hat{a}_{n-L}(\rho'_{n-1})\}$ --; lines 10-11, after "symbols" and before "need not" replace " $\{\hat{a}_{n-3}(\rho'_{n-1}), \hat{a}_{n-3}(\rho'_{n-1}(\rho'_{n-1})\}$ " with -- $\{\hat{a}_{n-2}(\rho'_{n-1}), \hat{a}_{n-3}(\rho'_{n-1}), ..., \hat{a}_{n-K-1}(\rho'_{n-1})\}$ --.

UNITED STATES PATENT AND TRADEMARK OFFICE
CERTIFICATE OF CORRECTION

PATENT NO. : 7,363,576 B2
APPLICATION NO. : 11/234446
DATED : April 22, 2008
INVENTOR(S) : Azadet et al.

It is certified that error appears in the above-identified patent and that said Letters Patent is hereby corrected as shown below:

Column 8, line 17, that portion of the sequence after " $(\hat{a}_{n-2}(\rho'_{n-1}),$ " and before "the" reading " $\hat{a}_{n-L}(\rho'_{n-1}))$ " should read -- $\hat{a}_{n-3}(\rho'_{n-1}), ..., \hat{a}_{n-L}(\rho'_{n-1}))$ --; line 19, the left hand side of the formula (13) reading " $\tilde{u}_n(\rho_{n-1}, \hat{a}_{n-1}]$ " should read -- $\tilde{u}_n(\rho'_{n-1}, \hat{a}_{n-1})$ --.

Column 8, line 23, that portion of the left hand side of the formula (14) reading " $\lambda_n$ " should read -- $\lambda'_n$ --; line 26, after "input" and before "can" replace "an" with -- $a_n$ --.

Column 8, line 32, after " $\lambda'_n($ " and before ")" replace " $z_n, a_n, \rho'n$-, $a_n$-" with -- $z_n, a_n, \rho'_{n-1}, \hat{a}_{n-1}$ --; line 36, that portion of the right hand side of the formula (16) reading " $\lambda$ " should read -- $\lambda'_n$ --; line 61, that portion of the right hand side of the formula (17) after "$f_i$" and before "(" reading " $\hat{a}_{n-1}$ " should be changed to -- $\hat{a}_{n-i}$ --.

Column 9, line 7, that portion of the survivor sequence after " $\hat{a}_{n-M}$ " and before " $,\hat{a}_{n-M-1}$ " reading "$(\rho'_{n-}]$" should read -- $(\rho'_{n-M+1}]$ --; line 25, the left hand side of the formula (22) reading "$v_n\{\rho'_{n-k+}1)$" should read -- $v_n(\rho'_{n-k+1})$ --.

Column 9, line 29, that portion of the right hand side of the formula after "→" reading "$\rho'_{n-k+1}$" should read -- $\rho_{n-k+1}$ --; line 32, after "metrics" and before "can be" replace " $\lambda_{n,\rho'_{n-1}},\hat{u}_{n-1}$ " with -- $\tilde{\lambda}'_n(z_n, a_n, \rho'_{n-1}, \hat{a}_{n-1})$ --.

Column 11, line 53, remove "(" before "which".

Column 13, line 46, after "state" and before "which" replace "p," with -- $\rho_n$ --; line 62, after "estimate" and before "which" replace "$v_{f+2,j}(\rho_{n+j})$" with -- $v_{n+2,f}(\rho_{n+1})$ --.

UNITED STATES PATENT AND TRADEMARK OFFICE
CERTIFICATE OF CORRECTION

PATENT NO. : 7,363,576 B2
APPLICATION NO. : 11/234446
DATED : April 22, 2008
INVENTOR(S) : Azadet et al.

It is certified that error appears in the above-identified patent and that said Letters Patent is hereby corrected as shown below:

Column 14, line 18, after "$\{\rho_n\} \rightarrow$" and before "." replace "$\{\Sigma_{n+1}\}$" with -- $\{\rho_{n+1}\}$ --; line 40, after "that" and before "is" replace "an," with -- $\tilde{a}_{n,j}$ --.

Column 14, line 50, that portion of the right hand side of the formula reading "$a_{n+1,j}$" should read -- $a_{n+1,j}$ --; line 65, after "$a_{n+1,j}$," and before ")" replace "$\rho_{n,j}$" with -- $\rho_n, \tilde{a}_{n,j}$ --.

Column 15, line 5, after "state" and before "being" replace "on" with -- $\rho_n$ --.

In claim 11, column 16, lines 40-41, after "group of" and before "taps based on" replace "postcursors" with -- postcursor --.

In claim 17, column 18, line 11, after "unit" and before "precomputing" replace "from" with -- for --.

Signed and Sealed this

Ninth Day of June, 2009

JOHN DOLL
*Acting Director of the United States Patent and Trademark Office*